(12) United States Patent
Ruby et al.

(10) Patent No.: US 10,469,056 B2
(45) Date of Patent: Nov. 5, 2019

(54) ACOUSTIC FILTERS INTEGRATED INTO SINGLE DIE

(71) Applicant: Avago Technologies General IP (Singapore) Pte. Ltd, Singapore (SG)

(72) Inventors: Richard C. Ruby, Menlo Park, CA (US); Seungku Lee, San Jose, CA (US); Stephen Roy Gilbert, San Francisco, CA (US); David Archbold, Pleasanton, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 194 days.

(21) Appl. No.: 15/639,124

(22) Filed: Jun. 30, 2017

(65) Prior Publication Data

US 2017/0302251 A1    Oct. 19, 2017

Related U.S. Application Data

(63) Continuation-in-part of application No. 14/866,394, filed on Sep. 25, 2015, which is a continuation-in-part
(Continued)

(51) Int. Cl.
*H03H 9/70* (2006.01)
*H03H 9/64* (2006.01)
(Continued)

(52) U.S. Cl.
CPC .......... *H03H 9/70* (2013.01); *H03H 9/02055* (2013.01); *H03H 9/02574* (2013.01);
(Continued)

(58) Field of Classification Search
CPC .......... H03H 9/02055; H03H 9/02574; H03H 9/02614; H03H 9/0576; H03H 9/25;
(Continued)

(56) References Cited

U.S. PATENT DOCUMENTS

| | | | |
|---|---|---|---|
| 3,887,887 A | 6/1975 | Wagers et al. | |
| 4,163,201 A | 7/1979 | Takahashi et al. | |

(Continued)

FOREIGN PATENT DOCUMENTS

| | | | |
|---|---|---|---|
| JP | 56-114423 A | 9/1981 | |
| JP | 05-063500 A | 3/1993 | |

(Continued)

OTHER PUBLICATIONS

Office Action dated Sep. 18, 2017 in co-pending U.S. Appl. No. 14/866,394, 15 pages.

(Continued)

*Primary Examiner* — Barbara Summons

(57) ABSTRACT

A multiplexer device includes a single die, at least three acoustic filters and at least one antenna port arranged on the single die, and a shunt inductance connected between each of the at least one antenna port and ground. Each acoustic filter includes one of a transmit or receive filter corresponding to a predetermined radio frequency band. The at least one antenna port is connected to at least one antenna, respectively, where each of the at least one antenna port is further connected to at least one acoustic filter arranged on the single die, and is configured to pass RF signals corresponding to the predetermined RF band of the connected at least one acoustic filter. The shunt inductance provides impedance matching between each of the at least one antenna port and each of the at least one acoustic filter connect to the at least one antenna port.

22 Claims, 11 Drawing Sheets

Related U.S. Application Data of application No. 14/835,679, filed on Aug. 25, 2015, now Pat. No. 10,020,796.

(51) Int. Cl.
  *H03H 9/54* (2006.01)
  *H03H 9/25* (2006.01)
  *H03H 9/02* (2006.01)
  *H03H 9/72* (2006.01)
  *H03H 9/05* (2006.01)

(52) U.S. Cl.
  CPC ...... *H03H 9/02614* (2013.01); *H03H 9/0576* (2013.01); *H03H 9/25* (2013.01); *H03H 9/54* (2013.01); *H03H 9/6406* (2013.01); *H03H 9/6483* (2013.01); *H03H 9/72* (2013.01)

(58) Field of Classification Search
  CPC ...... H03H 9/54; H03H 9/6406; H03H 9/6483; H03H 9/70; H03H 9/703; H03H 9/706; H03H 9/72; H03H 9/725
  USPC .......................................................... 333/133
  See application file for complete search history.

(56) References Cited

U.S. PATENT DOCUMENTS

| | | | |
|---|---|---|---|
| 4,388,600 A | 6/1983 | Wakino et al. | |
| 4,647,881 A * | 3/1987 | Mitsutsuka | H03H 9/02976 310/313 R |
| 4,879,487 A | 11/1989 | Sugai et al. | |
| 5,446,330 A | 8/1995 | Eda et al. | |
| 5,708,402 A | 6/1998 | Hachisu et al. | |
| 5,864,260 A * | 1/1999 | Lee | H03H 9/0576 333/133 |
| 6,060,818 A | 5/2000 | Ruby et al. | |
| 6,724,278 B1 * | 4/2004 | Smith | H04B 1/005 333/101 |
| 6,870,441 B2 * | 3/2005 | Veyres | H03H 7/0115 333/127 |
| 6,911,708 B2 * | 6/2005 | Park | H03H 9/02094 257/125 |
| 7,148,769 B2 | 12/2006 | Takano | |
| 7,213,314 B2 | 5/2007 | Abbott et al. | |
| 7,331,092 B2 | 2/2008 | Miura et al. | |
| 7,501,912 B2 | 3/2009 | Jamneala et al. | |
| 7,504,759 B2 | 3/2009 | Sobu et al. | |
| 7,602,264 B2 * | 10/2009 | Itou | H03H 9/6433 333/133 |
| 7,609,129 B2 | 10/2009 | Yokota et al. | |
| 7,675,387 B2 | 3/2010 | Sakiyama | |
| 7,728,485 B2 | 6/2010 | Handtmann et al. | |
| 7,800,464 B2 | 9/2010 | Tajima et al. | |
| 7,939,987 B1 | 5/2011 | Solal et al. | |
| 8,035,464 B1 | 10/2011 | Abbott et al. | |
| 8,866,365 B2 | 10/2014 | Hori et al. | |
| 8,946,904 B2 | 2/2015 | Railkar et al. | |
| 8,997,320 B2 | 4/2015 | Fuyutsume et al. | |
| 9,243,316 B2 | 1/2016 | Larson, III et al. | |
| 9,287,850 B2 * | 3/2016 | Yamashita | H03H 9/725 |
| 9,391,666 B1 | 7/2016 | Handtmann et al. | |
| 2003/0022412 A1 | 1/2003 | Higgins et al. | |
| 2003/0199105 A1 | 10/2003 | Kub et al. | |
| 2004/0226162 A1 | 11/2004 | Miura et al. | |
| 2005/0088257 A1 | 4/2005 | Ruby et al. | |
| 2005/0206478 A1 * | 9/2005 | Satoh | H03H 7/465 333/133 |
| 2006/0043822 A1 | 3/2006 | Yokota | |
| 2008/0024037 A1 | 1/2008 | Tamura et al. | |
| 2008/0106354 A1 | 5/2008 | Kando | |
| 2010/0188165 A1 * | 7/2010 | Nakamura | H04B 1/0057 333/124 |
| 2014/0132117 A1 | 5/2014 | Larson, III | |
| 2014/0227434 A1 | 8/2014 | Iwamoto | |
| 2014/0320234 A1 | 10/2014 | Takemura | |
| 2015/0069882 A1 | 3/2015 | Umeda et al. | |
| 2015/0171823 A1 | 6/2015 | Brawley | |
| 2017/0063329 A1 | 3/2017 | Gilbert et al. | |
| 2017/0063330 A1 | 3/2017 | Gilbert et al. | |
| 2017/0063331 A1 | 3/2017 | Gilbert et al. | |
| 2017/0063332 A1 | 3/2017 | Gilbert et al. | |
| 2017/0063333 A1 | 3/2017 | Gilbert et al. | |
| 2017/0063338 A1 | 3/2017 | Gilbert et al. | |
| 2017/0063339 A1 | 3/2017 | Burak et al. | |
| 2017/0085247 A1 | 3/2017 | Ruby et al. | |
| 2017/0222619 A1 | 8/2017 | Iwamoto | |
| 2017/0250673 A1 | 8/2017 | Ruby et al. | |

FOREIGN PATENT DOCUMENTS

| | | |
|---|---|---|
| JP | 05-283971 A | 10/1993 |
| JP | 2000-278090 A | 10/2000 |
| JP | 2001-053579 A | 2/2001 |
| JP | 2002-330047 A | 11/2002 |
| JP | 2005-229455 A | 8/2005 |
| JP | 2005-347295 | 12/2005 |
| JP | 1723207 B2 | 7/2011 |
| JP | 2012-015767 A | 1/2012 |
| JP | 2015-115870 A1 | 6/2015 |
| JP | 5814727 B2 | 11/2015 |
| WO | 2016/084526 | 6/2016 |

OTHER PUBLICATIONS

Office Action dated Sep. 22, 2017 in co-pending U.S. Appl. No. 15/009,801 13 pages.
Advisory Action dated Aug. 11, 2017 in co-pending U.S. Appl. No. 14/866,394, 4 pages.
Office Action dated Sep. 28, 2017 in co-pending U.S. Appl. No. 15/056,664, 22 pages.
Maszara, "Silicon-on-Insulator by Wafer Bonding: A Review"; The Electromechanical Society, Inc., Journal of Electrochemical Society, vol. 138, No. 1, Jan. 1991, pp. 341-347.
English language machine translation of JP2005-347295, published Dec. 15, 2005, 7 pages.
Kochar, et al., "NSPUDT using C-Axis tilted ScAlN Thin Film", Frequency Control Symposium and the European Frequency and Time Forum (FCS), 2015 Joint Conference of the IEEE International, Apr. 2015, 4 pages.
Advisory Action dated Aug. 14, 2017 in co-pending U.S. Appl. No. 14/866,273, 6 pages.
English language machine translation of JP2000-278090, published Oct. 6, 2000, 5 pages.
English language machine translation of JP2002-330047, published Nov. 15, 2002, 9 pages.
English language machine translation of JP2012-15767, published Jan. 19, 2012, 3 pages.
English language machine translation of WO2016l084526, published Jun. 29, 2016, 19 pages.
Notice of Allowance dated Oct. 19, 2017 in co-pending U.S. Appl. No. 14/835,679, 5 pages.
Final Office Action dated Jan. 2, 2018 in co-pending U.S. Appl. No. 14/866,273, 18 pages.
Kobayashi et al., "A Study on Temperature-Compensated Hybrid Substrates for Surface Acoustic Wave Filters", 2010 IEEE International Ultrasonics Symposium Proceedings, p. 637-640.
Office Action dated Dec. 1, 2016 in co-pending U.S. Appl. No. 14/835,679, 107 pages.
English language machine translation of JP 05-063500 A, published Mar. 12, 1993, 3 pages.
English language machine translation of JP 56-114423 A, published Sep. 9, 1981, 2 pages.
English language machine translation of JP 2015-115870 A, published Jun. 22, 2015, 28 pages.
Office Action dated Dec. 6, 2016 in co-pending U.S. Appl. No. 14/866,273, 107 pages.
English language machine translation of JP4723207, published Jul. 13, 2011, 14 pages.

(56) References Cited

OTHER PUBLICATIONS

English language machine translation of JP2005-229455, published Aug. 25, 2005, 9 pages.
English language machine translation of JP5814727, published Nov. 17, 2015, 16 pages.
Final Office Action dated Jun. 16, 2017 in co-pending U.S. Appl. No. 14/866,273, 11 pages.
Office Action dated Jun. 29, 2017 in co-pending U.S. Appl. No. 14/866,394, 22 pages.
English language machine translation of JP 2001-053579 A. published Feb. 23, 2001, 7 pages.
Office Action dated Dec. 12, 2016 in co-pending U.S. Appl. No. 14/866,394, 71 pages.
Ex Parte Reexamination Certificate issued Dec. 13, 2011 for U.S. Pat. No. 6,060,818, 4 pages.
Office Action dated Sep. 15, 2017 in co-pending U.S. Appl. No. 14/866,273, 13 pages.

\* cited by examiner

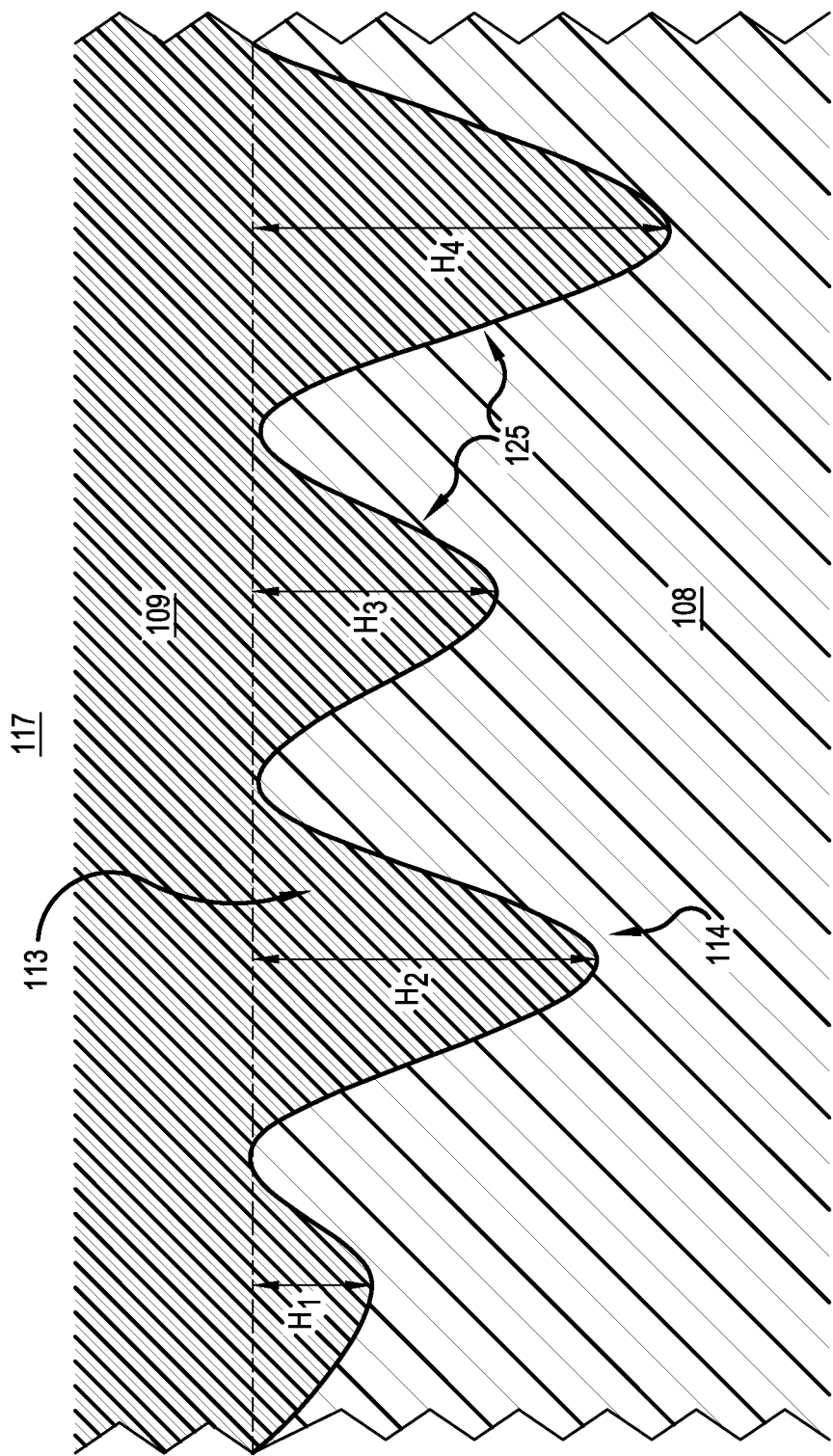

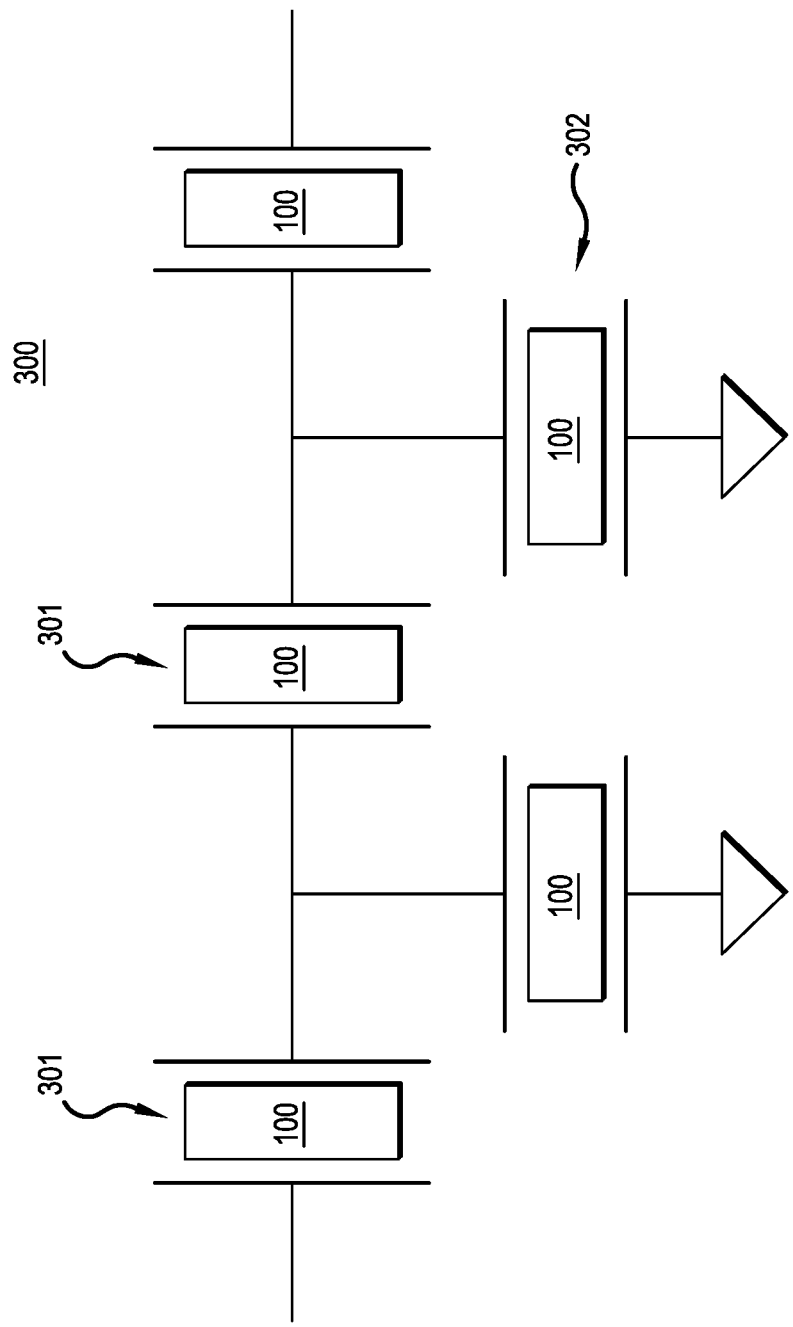

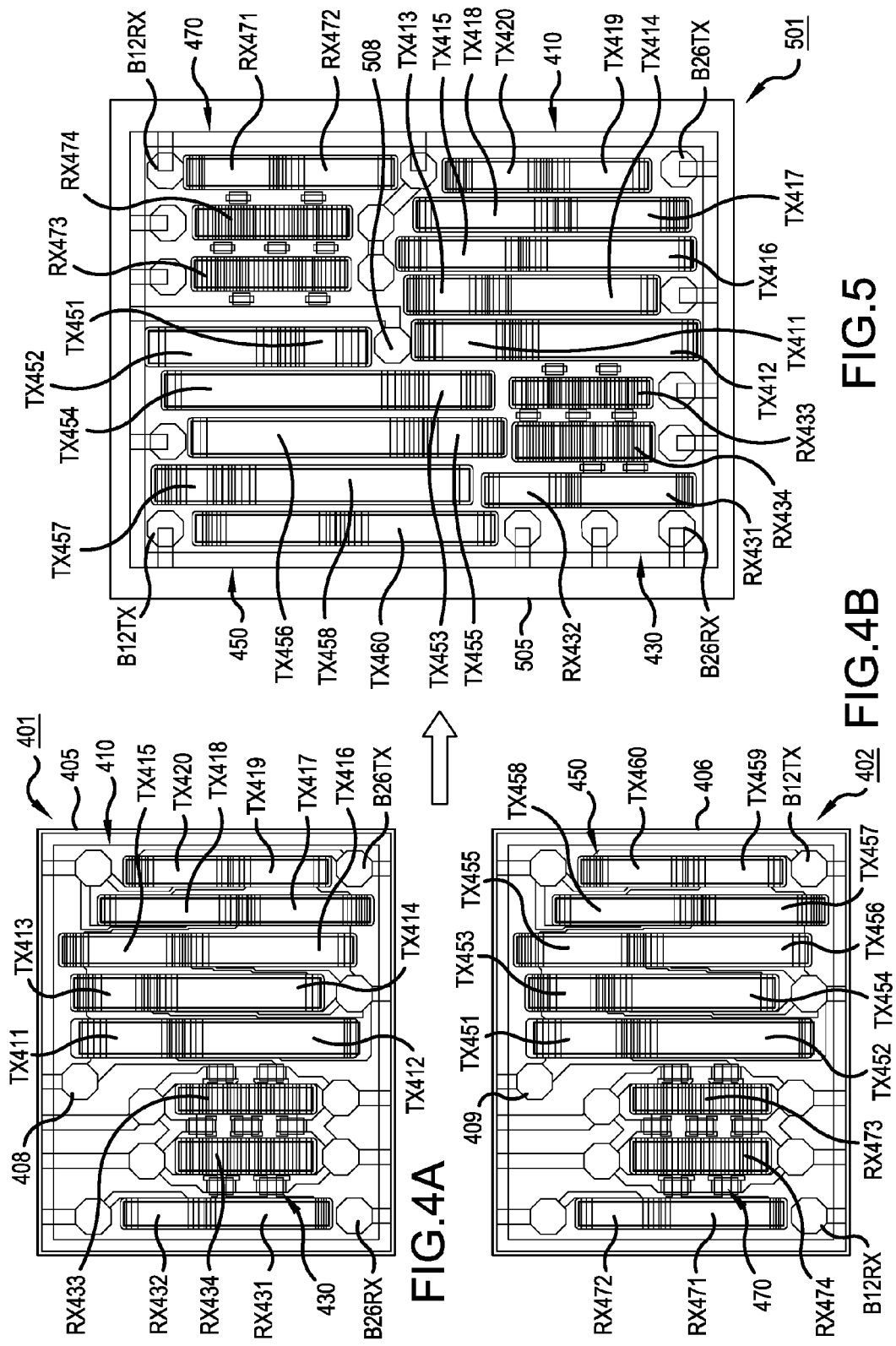

ACOUSTIC FILTERS INTEGRATED INTO SINGLE DIE

CROSS-REFERENCE TO RELATED APPLICATIONS

The present application is a continuation-in-part under 37 C.F.R. § 1.53(b) of, and claims priority under 35 U.S.C. § 120 from, U.S. patent application Ser. No. 14/866,394 filed on Sep. 25, 2015, naming Stephen Roy Gilbert et al. as inventors, which is a continuation-in-part under 37 C.F.R. § 1.53(b) of, and claims priority under 35 U.S.C. § 120 from, U.S. patent application Ser. No. 14/835,679 filed on Aug. 25, 2015, naming Stephen Roy Gilbert, et al. as inventors. The entire disclosures of U.S. patent application Ser. Nos. 14/866,394 and 14/835,679 are specifically incorporated herein by reference.

BACKGROUND

Electrical resonators are widely incorporated in modern electronic devices. For example, in wireless communications devices, radio frequency (RF) and microwave frequency resonators are used in filters, such as filters having electrically connected series and shunt resonators forming ladder and lattice structures. The filters may be included in a multiplexer, such as a duplexer, for example, connected between an antenna (or multiple antennas as in the case of multiple input, multiple output (MIMO) designs) and a transceiver for filtering received and transmitted signals, typically within a predetermined radio frequency band. Other types of multiplexers in which the filters may be included are diplexers, triplexers, quadplexers, quintplexers and the like, for example. The multiplexer interfaces between the antenna and each of various networks to enable transmitting signals on different transmit (uplink) frequencies and receiving signals on different receive (downlink) frequencies. The filters associated with the multiplexer typically include band pass filters, which provide passbands for passing various transmitted and received signals through relatively narrow frequency bands (blocking all signals with frequencies outside the passbands).

Various types of filters use mechanical or acoustic resonators, such as surface acoustic wave (SAW) resonators. The mechanical/acoustic resonators convert electrical signals to mechanical signals or vibrations, and/or convert mechanical signals or vibrations to electrical signals. While certain surface modes are desired, certain standing spurious modes can exist between the opposing faces of the piezoelectric material of a SAW resonator. These spurious modes are parasitic, and can impact the performance of filters comprising SAW resonators.

In addition, many modern electronic devices communicate wirelessly more than one predetermined frequency or frequency band. For example, a wireless telephone may be designed to enable communications over two networks using radio frequency (RF) signals, such as Long-Term Evolution (LTE®) band B12 (uplink frequency band of 699 MHz-716 MHz and downlink frequency band of 729 MHz 746 MHz), and LTE band B26 (uplink frequency band of 814 MHz 849 MHz and downlink frequency band of 859 MHz-894 MHz), for example, although other types of networks and/or numbers of communication bands may be incorporated. Accordingly, this wireless telephone would require two transceivers and associated duplexers (including filters), one duplexer that enables transmitting and receiving band B12 signals and another for transmitting and receiving band B26 signals over one or more antennas.

Duplexer and higher band count multiplexers utilize single filter dies (for transmit and receive circuitry) for corresponding frequency bands, respectively. For example, in the above example, the wireless telephone would have one die for the band B12 duplexer and another die for the band B26 duplexer when using SAW resonator filters. (Generally, for filters comprising SAW resonators, there is one die for a duplexer, although for filters comprising thin-film bulk acoustic resonators (FBARs), there is typically one die per filter, not per duplexer.) Each die also includes its own antenna port for a dedicated or common antenna. Distribution on separate dies is necessitated, in part, by conventional die substrates, which are structurally inadequate to support the amount and density of circuitry (e.g., numerous acoustic resonators and band pass filters comprised of the same) required for operation of the wireless telephone over the multiple frequency bands. The multiple dies for the multiple frequency bands increase various costs, such as material costs, wafer costs, and die sorting costs. They also require additional space, which is at a premium when attempting to minimize the physical size of an electronic device.

As another example, for a conventional Quadplexer Integrated into a Single Chip (QISC), four dies are required (two transmit and two receive). For thin-film bulk acoustic resonator (FBAR) filters, each die is from a different wafer, where each wafer can have its own mask set (from 15 to 25 masks). Furthermore, each filter requires its own test, and if found "good" (passing), is placed in a tape and reel (T&R). But, if the die requires multiple RF tests prior to assembly, the die sort cost goes up. For SAW resonator devices, there is a reluctance to integrate multiple filter functions into a single die due to the fact that, as the die gets larger, the mechanical stresses on the SAW substrate are such that the part is likely to crack upon assembly, as mentioned above. Typically, SAW resonator devices are either single filter function or at most dual filter function (receive and transmit to form a duplexer).

Also, each acoustic resonator filter requires a wafer scale package. When doing four independent filters, for example, one can imagine four wafer scale packages for the four dies from the four wafers. Current wireless devices, such as iPhones, require many frequency bands to be covered, now more than 20 frequency bands. The filters, as well as a necessary "keep out" region around each filter, cause the filter area to be quite large. The "keep-out" area is due to the matching circuits buried under the die and assembly rules about minimum spacing for printed circuit board (PCB) loading.

What is needed, therefore, is a die capable of supporting multiple acoustic resonator structures for multiple frequency bands, overcoming at least the shortcomings of known SAW resonators described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals, refer to like elements.

FIG. 1F is a cross-sectional view of a portion of the SAW resonator structure of FIG. 1C.

FIG. 3 is a simplified schematic block diagram of a filter comprising a SAW resonator structure according to a representative embodiment.

FIG. 4A is a top plan view of conventional duplexer, including transmit and receive SAW resonator filters on a conventional die, for sending and receiving signals in pre-determined frequency band (i.e., band B26).

FIG. 4B is a top plan view of conventional duplexer, including transmit and receive SAW resonator filters on a conventional die, for sending and receiving signals in pre-determined frequency band (i.e., band B12).

FIG. 5 is a top plan view of the transmit and receive SAW resonator filters, depicted in FIGS. 4A and 4B, integrated into a single die, according to a representative embodiment.

DETAILED DESCRIPTION

Figure 1A:
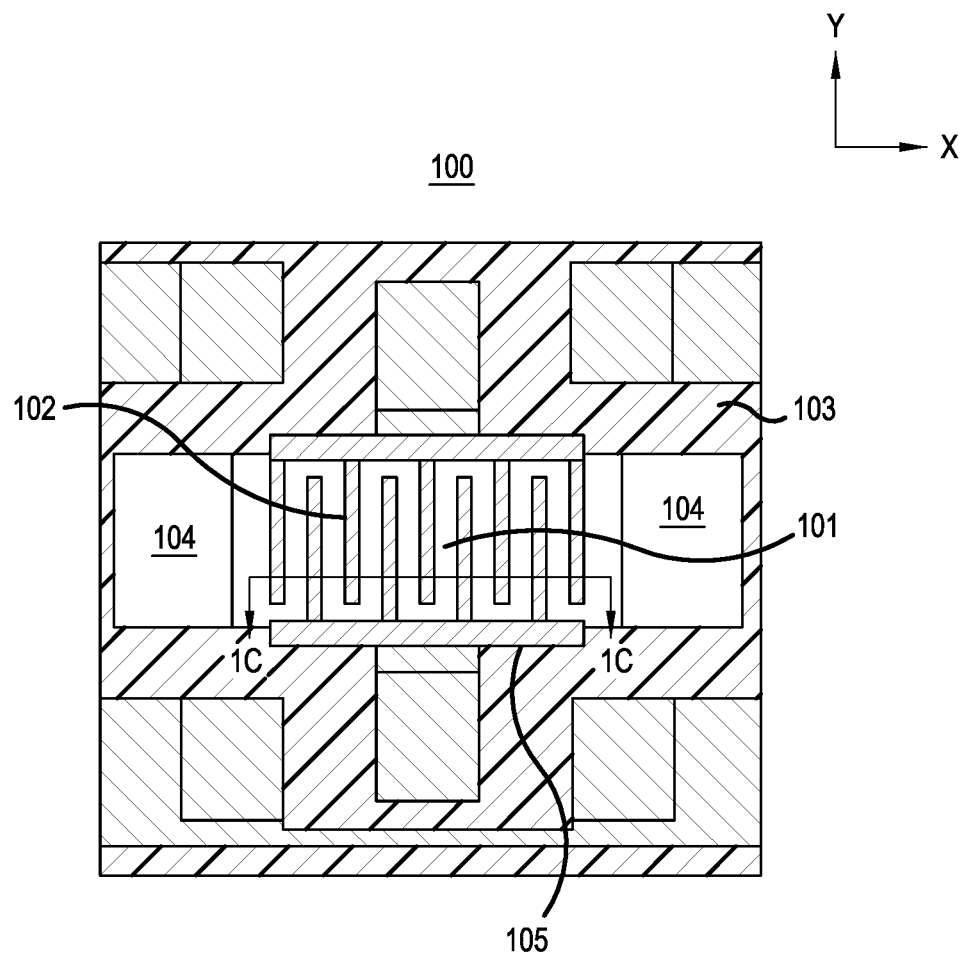
FIG. 1A is a top view of a SAW resonator structure according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

In accordance with a representative embodiment, a SAW resonator structure includes a substrate having a first (upper) surface and a second (lower) surface. A piezoelectric layer is disposed over the substrate. The piezoelectric layer has a first (upper) surface and a second (lower) surface. The second surface of the piezoelectric layer is roughened, such that it has a plurality of features. A plurality of electrodes is disposed over the first surface of the piezoelectric layer, where the electrodes are configured to generate surface acoustic waves in the piezoelectric layer. The SAW resonator structure also includes an additional layer disposed between the first surface of the substrate and the second (roughed) surface of the piezoelectric layer, the first (upper) surface of the additional layer having a smoothness sufficient to foster atomic bonding between the first surface of the additional layer and the second surface of the piezoelectric layer, wherein the features reflect acoustic waves back into the piezoelectric layer.

In accordance with another representative embodiment, a multiplexer device includes a single die, at least three acoustic filters arranged on the single die, at least one antenna port arranged on the single die and connected to at least one antenna, respectively, and a shunt inductance connected between each of the at least one antenna port and ground. Each acoustic filter includes one of a transmit filter or a receive filter corresponding to a predetermined radio frequency (RF) band. Each of the at least one antenna port is further connected to at least one acoustic filter of the at least three acoustic filters arranged on the single die, and is configured to pass RF signals corresponding to the predetermined RF band of the connected at least one acoustic filter. The shunt inductance provides impedance matching between each of the at least one antenna port and the connected at least one acoustic filter.

The single die on which the at least three acoustic filters is arranged includes a substrate having a polished first (upper) surface; a piezoelectric layer disposed over the substrate, the piezoelectric layer having roughened second (lower) surface; and an oxide layer disposed between the polished first surface of the substrate and the roughened second surface of the piezoelectric layer. The oxide layer has a polished second (lower) surface in contact with the polished first surface of the substrate, and has a first (upper) surface filling spaces between features defined by the roughened second surface of the piezoelectric layer. The polished first surface of the substrate and the polished second surface of the oxide layer each have a smoothness sufficient to foster atomic bonding between the polished first surface of the substrate and the polished second surface of the oxide layer.

Generally, according to various embodiments, integration of more than two filter functions in a single die, as described herein, significantly reduces the total die area (where multiple dies would otherwise need to be incorporated), shrink an overall area on the PCB of the electronic device (e.g., wireless telephone), and reduce the number of RF tests and T&R. As an initial matter, in order to integrate more than two filter functions (e.g., at least three filter functions) on a single die, a die substrate is needed that is structurally robust, capable of enduring mechanical stresses of the additional filter components (particularly SAW resonators) that would otherwise crack the die substrate upon assembly. Such a structurally robust die substrate is described above with reference to FIGS. 1A-3.

FIG. 1A is a top view of a SAW resonator structure 100 according to a representative embodiment. Notably, the SAW resonator structure 100 is intended to be merely illustrative of the type of device that can benefit from the present teachings. Other types of SAW resonators, including, but not limited to a dual mode SAW (DMS) resonators, and structures therefore, are contemplated by the present teachings. The SAW resonator structure 100 of the present teachings is contemplated for a variety of applications. By way of example, and as described in connection with FIG. 3, a plurality of SAW resonator structures 100 can be connected in a series/shunt arrangement to provide a ladder filter.

The SAW resonator structure 100 comprises a piezoelectric layer 103 disposed over a substrate (not shown in FIG. 1A). In accordance with representative embodiments, the piezoelectric layer 103 comprises one of: lithium niobate (LiNbO$_3$), which is commonly abbreviated as LN; or lithium tantalate (LiTaO$_3$), which is commonly abbreviated as LT.

The SAW resonator structure 100 comprises an active region 101, which comprises a plurality of interdigitated transducers (IDTs) or interdigitated electrodes 102 disposed over a piezoelectric layer 103, with acoustic reflectors 104 situated on either end of the active region 101. In the presently described representative embodiment, electrical connections are made to the SAW resonator structure 100 using the busbar structures 105.

As is known, the pitch of the resonator electrodes determines the resonance conditions, and therefore the operating frequency of the SAW resonator structure 100. Specifically, the interdigitated electrodes are arranged with a certain pitch between them, and a surface wave is excited most strongly when its wavelength is the same as the pitch of the electrodes. The equation $f_0=v/\lambda$ describes the relation between the resonance frequency ($f_0$), which is generally the operating frequency of the SAW resonator structure 100, and the propagation velocity (v) of a surface wave. These SAW waves comprise Rayleigh or Leaky waves, as is known to one of ordinary skill in the art, and form the basis of function of the SAW resonator structure 100.

Figure 1B:
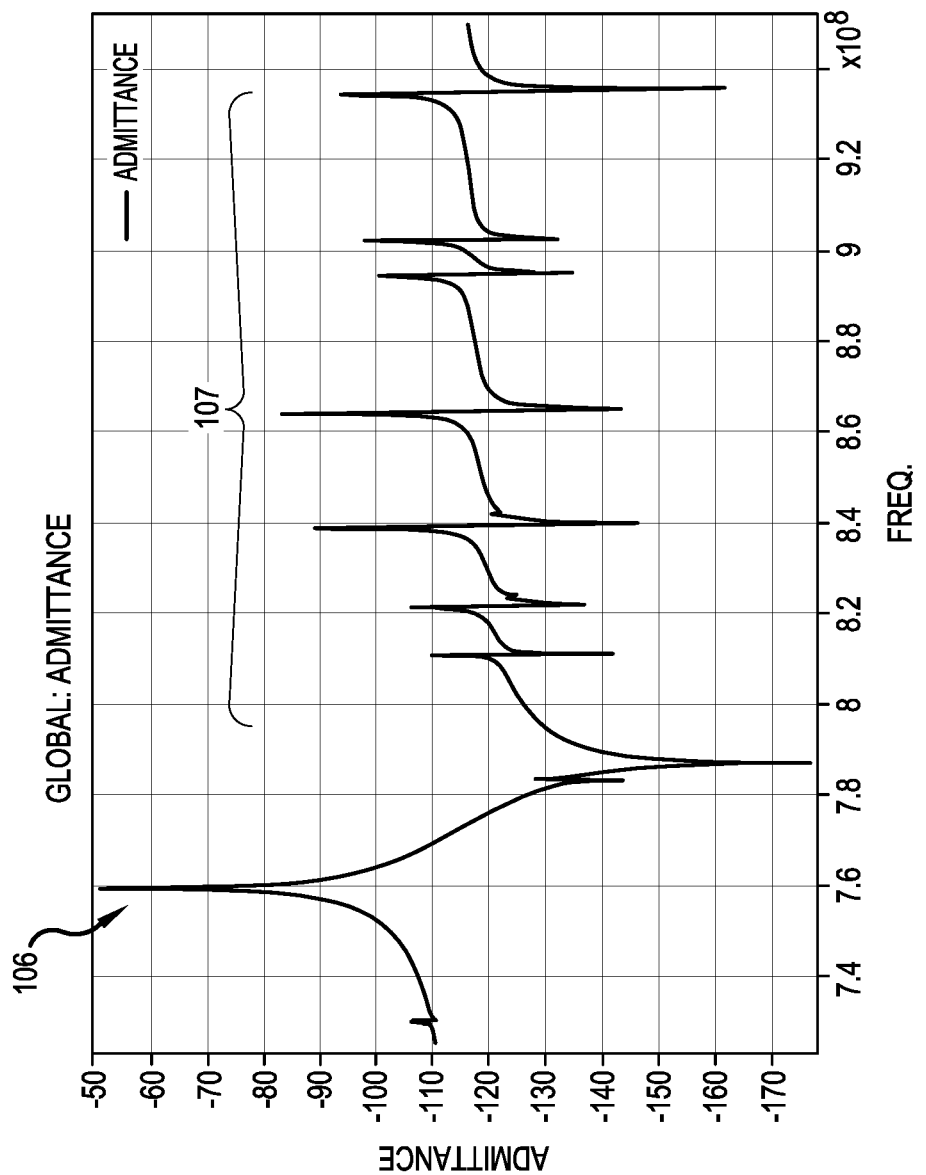
FIG. 1B is a graph of admittance versus frequency.
Figure 1C:
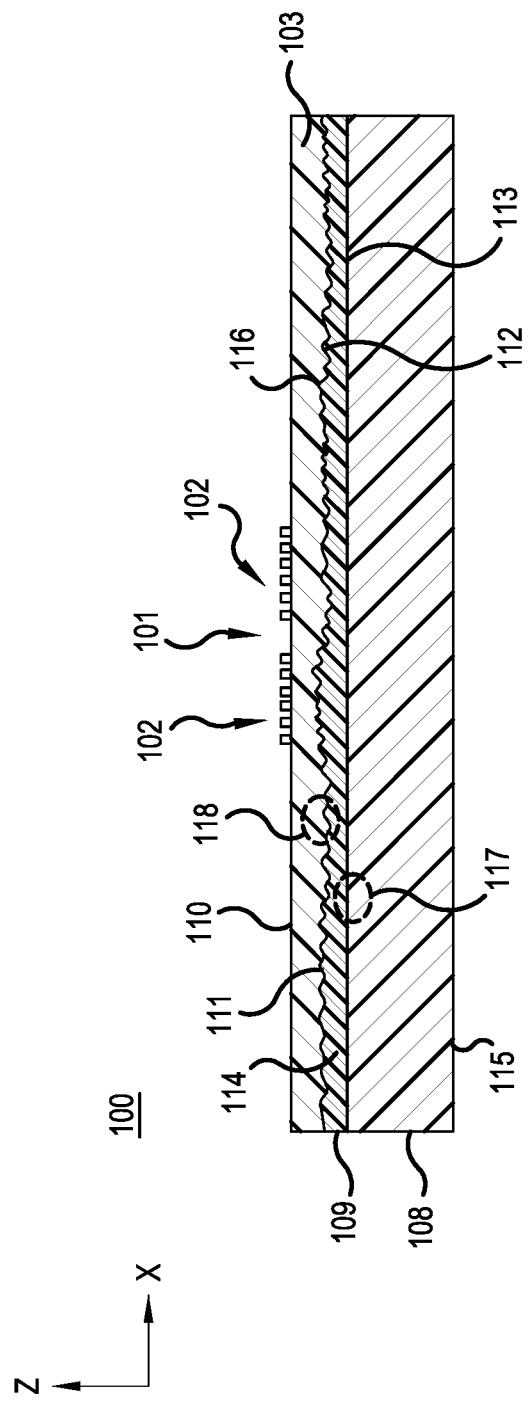
FIG. 1C is the cross-sectional view of the SAW resonator structure of FIG. 1A along line 1C-1C.

Generally, there is a desired fundamental mode, which is typically a Leaky mode, for the SAW resonator structure 100. By way of example, if the piezoelectric layer 103 is a 42° rotated LT, the shear horizontal mode will have a displacement in the plane of the interdigitated electrodes 102 (the x-y plane of the coordinate system of FIG. 1A). The displacement of this fundamental mode is substantially restricted to near the upper surface (first surface 110 as depicted in FIG. 1C) of the piezoelectric layer 103. It is emphasized that the 42° rotated LT piezoelectric layer 103, and the shear horizontal mode are merely illustrative of the piezoelectric layer 103 and desired fundamental mode, and other materials and desired fundamental modes are contemplated.

However, other undesired modes, which are often referred to as spurious modes, are established. Turning to FIG. 1B, a graph of admittance versus frequency is depicted for the illustrative 42° rotated LT piezoelectric layer 103. The desired fundamental mode, the shear horizontal mode 106, is substantially restricted to the upper surface of the piezoelectric layer 103, and has a frequency at series resonance ($F_s$). However, a number of spurious modes 107, having frequencies greater than the frequency at parallel resonance ($F_p$), can exist in the piezoelectric layer 103. As described more fully below, these spurious modes 107 are created by acoustic waves generated in the piezoelectric layer 103 that establish standing waves of various kinds of modes (with different modal shapes and frequencies). More specifically, these spurious modes 107 are created by reflections at the interface of the piezoelectric layer 103 and the layer (see FIG. 1C) between the piezoelectric layer 103 and the substrate (see FIG. 1C) of the SAW resonator structure 100.

The spurious modes can deleteriously impact the performance of SAW resonators, and devices (e.g., filters) that include SAW resonators, if not mitigated. Most notably, if a first filter is comprised of one or more SAW resonators, and is connected to a second filter having a passband that overlaps the frequency of the spurious modes, a sharp reduction in the quality (Q) of the second filter will occur. The spurious modes are observed on a so-called Q-circle of a Smith Chart of the $S_{11}$ parameter. These sharp reductions in Q-factor are known as "rattles," and are strongest in the southeast quadrant of the Q-circle. Beneficially, significant mitigation of the adverse impact of these spurious modes is realized by the various aspects of the present teachings as described below.

FIG. 1C is a cross-sectional view of the SAW resonator structure 100 depicted in FIG. 1A along the lines 1C-1C. The SAW resonator structure 100 comprises a substrate 108 disposed beneath the piezoelectric layer 103, and a layer 109 disposed between the substrate 108 and the piezoelectric layer 103.

As noted above, the piezoelectric layer 103 illustratively comprises one of LN or LT. Generally, in the representative embodiments described below, the piezoelectric layer 103 is a wafer that is previously fabricated, and that is adhered to the layer 109 by atomic bonding as described more fully below.

The materials selected for the piezoelectric layer 103 can be divided into two types: one which has been used for a long time and with a high degree of freedom in design is used for Rayleigh wave substrates; the other, with less freedom and limited in design, is for Leaky wave substrates with low loss characteristics and easily reaches the higher frequencies by high acoustic velocity, and is mainly used for mobile communications. LN and LT materials are often used for broadband filters, and according to the filter specifications, the manufacturing materials and cutting angles differ. Filters for applications that require comparatively low loss mainly generally require Leaky wave materials, while Rayleigh wave materials are predominately used for communication equipment that requires low ripple and low group delay characteristics. Among Rayleigh wave materials, ST-cut crystal has the best temperature characteristics as a piezoelectric material.

In accordance with a representative embodiment, the substrate 108 comprises crystalline silicon, which may be polycrystalline or monocrystalline, having a thickness of approximately 100.0 µm to approximately 800.0 µm. Other polycrystalline or monocrystalline materials besides silicon are contemplated for use as the substrate 108 of the SAW resonator structure 100. By way of example, these materials include, but are not limited to, glass, single crystal aluminum oxide ($Al_2O_3$) (sometimes referred to as "sapphire"), and polycrystalline $Al_2O_3$, to name a few. In certain representative embodiments, in order to improve the performance of a filter comprising SAW resonator structure(s) 100, the substrate 108 may comprise a comparatively high-resistivity material. Illustratively, the substrate 108 may comprise single crystal silicon that is doped to a comparatively high resistivity.

The layer 109 is illustratively an oxide material, such as silicon dioxide ($SiO_2$), phosphosilicate glass (PSG), borosilicate glass (BSG), a thermally grown oxide, or other material amenable to polishing to a high degree of smoothness, as described more fully below. The layer 109 is deposited by a known method, such as chemical vapor deposition (CVD) or plasma enhanced chemical vapor deposition (PECVD), or may be thermally grown. As described more fully below, the layer 109 is polished to a thickness in the range of approximately 0.05 µm to approximately 6.0 µm.

The piezoelectric layer 103 has a first surface 110, and a second surface 111, which opposes the first surface 110. The second surface 111 is roughened, so it has a plurality of features 116 there-across. As noted above, undesired spurious modes are launched in the piezoelectric layer 103, and propagate down to the second surface 111. As described more fully below in connection with portion 118 in FIG. 1D, the plurality of features 116 reflect undesired spurious modes at various angles and over various distances to destructively interfere with the undesired spurious waves in the piezoelectric layer 103, and possibly enable a portion of these waves to be beneficially converted into desired SAW waves. Again as described more fully below, the reflections provided by the plurality of features 116 foster a reduction in the degree of spurious modes (i.e., standing waves), which are created by the reflection of acoustic waves at the interface of the second surface 111 of the piezoelectric layer 103 and the first surface 112 of layer 109. Ultimately, the reflections provided by the plurality of features 116 serve to improve the performance of devices (e.g., filters) that comprise a plurality of SAW resonator structures 100.

The substrate 108 has a first (upper) surface 114 and a second (lower) surface 115 opposing the first surface 114. In representative embodiments, the substrate 108 undergoes a chemical-mechanical polish (CMP) sequence to prepare the first surface to bond to the layer 109, as described below.

Layer 109 has a first (upper) surface 112 and a second (lower) surface 113. As noted above, and as described more fully below in connection with the description of portion 117 in FIG. 1F, the second surface 113 of layer 109 is polished, such as by chemical-mechanical polishing in order to obtain a "mirror" like finish with a comparatively low root-mean-square (RMS) variation of height. This low RMS variation of height significantly improves the contact area between the second surface 113 of the layer 109 and the first surface 114 of the substrate 108 to improve the atomic bonding between the first surface 114 and the second surface 113. As is known, the bond strength realized by atomic bonding is directly proportional to the contact area between two surfaces. As such, improving the flatness/smoothness of the second surface 113 fosters an increase in the contact area, thereby improving the bond of the layer 109 to the substrate 108. As used herein, the term "atomically smooth" means sufficiently smooth to provide sufficient contact area to provide a sufficiently strong bond strength between the layer 109 and the substrate 108, at the interface of their second and first surfaces 113, 114, respectively.

Figure 1D:
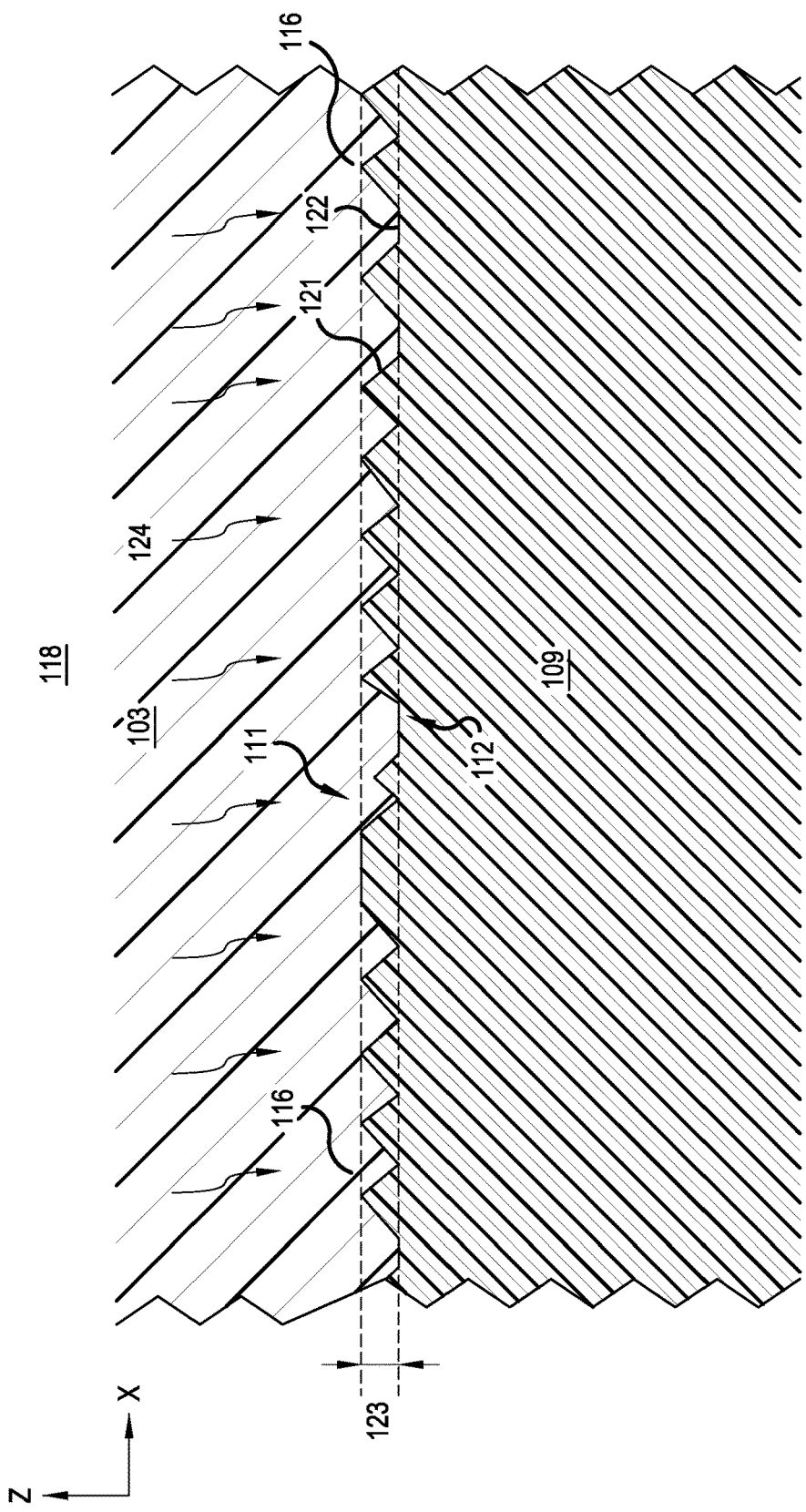
FIG. 1D is a cross-sectional view of a portion of the SAW resonator structure of FIG. 1C.

FIG. 1D is a cross-sectional view of a portion 118 of a SAW resonator structure 100 according to a representative embodiment. Portion 118 is depicted in FIG. 1D in magnified view to illustrate various aspects and functions of the plurality of features 116 of piezoelectric layer 103 along the interface of the first surface 112 of the layer 109 and the second surface 111 of the piezoelectric layer 103.

The shape, dimensions and spacing of the plurality of features 116 depend on their source (e.g., method of fabrication). In certain representative embodiments, the plurality of features 116 are provided by an unpolished wafer comprising the piezoelectric layer 103. In other representative embodiments, the plurality of features 116 are fabricated on the piezoelectric layer 103 using a known etching or roughening technique, and may have sides 121 with a slant that fosters diffusive reflection of spurious modes.

Notably, some of the plurality of features 116 may have comparatively "flat" bottoms 122. The plurality of features 116 also have a height 123 that may be substantially the same across the width of the interface between the substrate 108 and the layer 109. Additionally, the width (x-dimension in the coordinate system of FIG. 1C) of the plurality of features 116 may be the same, or may be different. Illustratively, the width of the plurality of features 116 is on the order of the desired fundamental mode of the SAW resonator structure 100.

Alternatively, and again depending on the source of the plurality of features 116 (i.e., unpolished wafer or the method of fabrication), the height 123 of the plurality of features 116 may not be the same. Rather, by having the height 123 of the plurality of features 116 not the same, a reduction in the incidence of more than one of the spurious modes can be realized.

The representative methods described presently for forming the plurality of features 116 are merely illustrative. Alternative methods, and thus alternative sizes and shapes of the plurality of features 116 are contemplated, and some are described below. Notably, regardless of the source of the plurality of features 116, which can be because of the unpolished wafer comprising the piezoelectric layer 103, or by a known etching technique, the plurality of features 116 are beneficially not arranged in a repetitive pattern, and thus are non-periodic. Rather, the plurality of features 116 are typically randomly located on the substrate 108, in order to avoid establishing conditions that would support standing waves (i.e., resonance conditions) in the piezoelectric layer 103, and thereby reduce the incidence of spurious modes in the piezoelectric layer 103.

The piezoelectric layer 103 is illustratively single-crystal material, or other material having crystalline properties. Like the teachings of the parent application, the present teachings make use of the etching properties of the piezoelectric layer 103 to realize the various characteristics of the plurality of features 116. However, and as described more fully below, while some etch selectivity to a specific crystalline plane is possible by etching the piezoelectric layer 103 according to the present teachings, this does not occur nearly to the degree as the etch selectivity realized in the etching of the substrate (e.g., silicon) described in the parent application. As such, while the plurality of features 116 are etched from the piezoelectric layer 103 to a desired height having sides 121 that are on a "slant" foster reflections at off-angles relative to the incident direction of the acoustic waves 124, the more defined shapes (e.g., pyramids) provided by the selective etching of silicon, for example, as described in the parent application, are less pronounced. However, and beneficially, the non-periodic nature of the plurality of features 116 of the roughened surface provided at the second surface 111 of the piezoelectric layer 103 does foster diffuse reflection of spurious waves as described more fully below.

Turning again to FIG. 1D, acoustic waves 124 are transmitted downwardly from the piezoelectric layer 103, having been generated by the SAW resonator structure 100. The acoustic waves 124 are incident on one or more of the plurality of features 116, and are reflected therefrom.

As noted above in connection with the description of FIG. 1B, there are multiple spurious modes, each having a different frequency and wavelength. In accordance with a representative embodiment, the height 123 of the plurality of features 116 off the substrate 108 is approximately one-fourth (¼) λ of one or more of the spurious modes. Selecting the height 123 of the plurality of features 116 to be approximately one-fourth (¼) λ of a particular spurious mode alters the phase of the reflected waves, and results in destructive interference by the reflected waves, and substantially prevents the establishment of standing waves, and thus spurious modes.

In some embodiments, the height 123 of the plurality of features 116 is substantially the same, and the height 123 is selected to be approximately one-fourth (¼) λ of one (e.g., a predominant) of the spurious modes. In other embodiments, the height 123 of the plurality of features 116 is not the same, but rather each different height is selected to be approximately equal to one-fourth (¼) λ of one of the multiple spurious modes (e.g., the spurious modes 107 depicted in FIG. 1B). By selecting this one height or multiple heights, the phase of the reflected waves is altered, and results in destructive interference by the reflected waves, thereby substantially preventing the establishment of standing waves of multiple frequencies, thus preventing the establishment of multiple spurious modes.

By way of example, if the spurious modes have a frequency of 700 MHz, the wavelength λ is approximately 6.0 μm. As such, the height 123 would be approximately 1.5 μm. By contrast, if the spurious modes have a frequency of 4200 MHz, the λ is approximately 1.0 μm. In this example, the height 123 would be approximately 0.25 μm. More generally, the height 123 is in the range of less than approximately 0.25 μm (e.g., 0.1 μm) to greater than approximately 1.5 μm (e.g., 2.5 μm). As will be appreciated, the range for the height 123 depends on the frequency of the fundamental mode.

The non-periodic orientation of the plurality of features 116, the generally, angled surfaces (e.g., side 121) provided by the plurality of features 116, and providing the height 123 of the plurality of features 116 to be in the noted range relative to the wavelength of the propagating spurious modes combine to alter the phase of the acoustic waves 124 incident on the various features. Beneficially, these factors in combination result in comparatively diffuse reflection of the acoustic waves 124 back through the piezoelectric layer 103. This comparatively diffuse reflection of the acoustic waves 124 from the plurality of features 116 will generally not foster constructive interference, and the establishment of resonance conditions. Accordingly, the plurality of features 116 generally prevent the above-noted parasitic acoustic standing waves (i.e., spurious modes) from being established from the acoustic waves 124 generated in the piezoelectric layer 103, which travel down and into the substrate 108.

One measure of the impact of the parasitic spurious modes on the performance of a device (e.g., filter) comprising a SAW resonator is the quality (Q) factor. For example, the parasitic spurious modes couple at the interfaces of the piezoelectric layer 103 and remove energy available for the desired SAW modes and thereby reduce the Q-factor of the resonator device. As is known, the Q-circle of a Smith Chart has a value of unity along its circumferences. The degree of energy loss (and therefore reduction in Q) is depicted with the reduction of the $S_{11}$ parameter off the unit circle. Notably, as a result of parasitic spurious modes and other acoustic losses, sharp reductions in Q of known devices can be observed on a so-called Q-circle of a Smith Chart of the $S_{11}$ parameter. These sharp reductions in Q-factor are known as "rattles" and are strongest in the southeast quadrant of the Q-circle. Beneficially, because of the diffuse reflections, and attendant phase mismatch of the reflected acoustic waves 124 realized by the plurality of features 116, compared to such known devices, a filter comprising SAW resonator structure 100 of representative embodiments of the present teachings, shows lesser magnitudes of the "rattles" and a somewhat "spreading" of the reduced "rattles" is experienced.

Figure 1E:
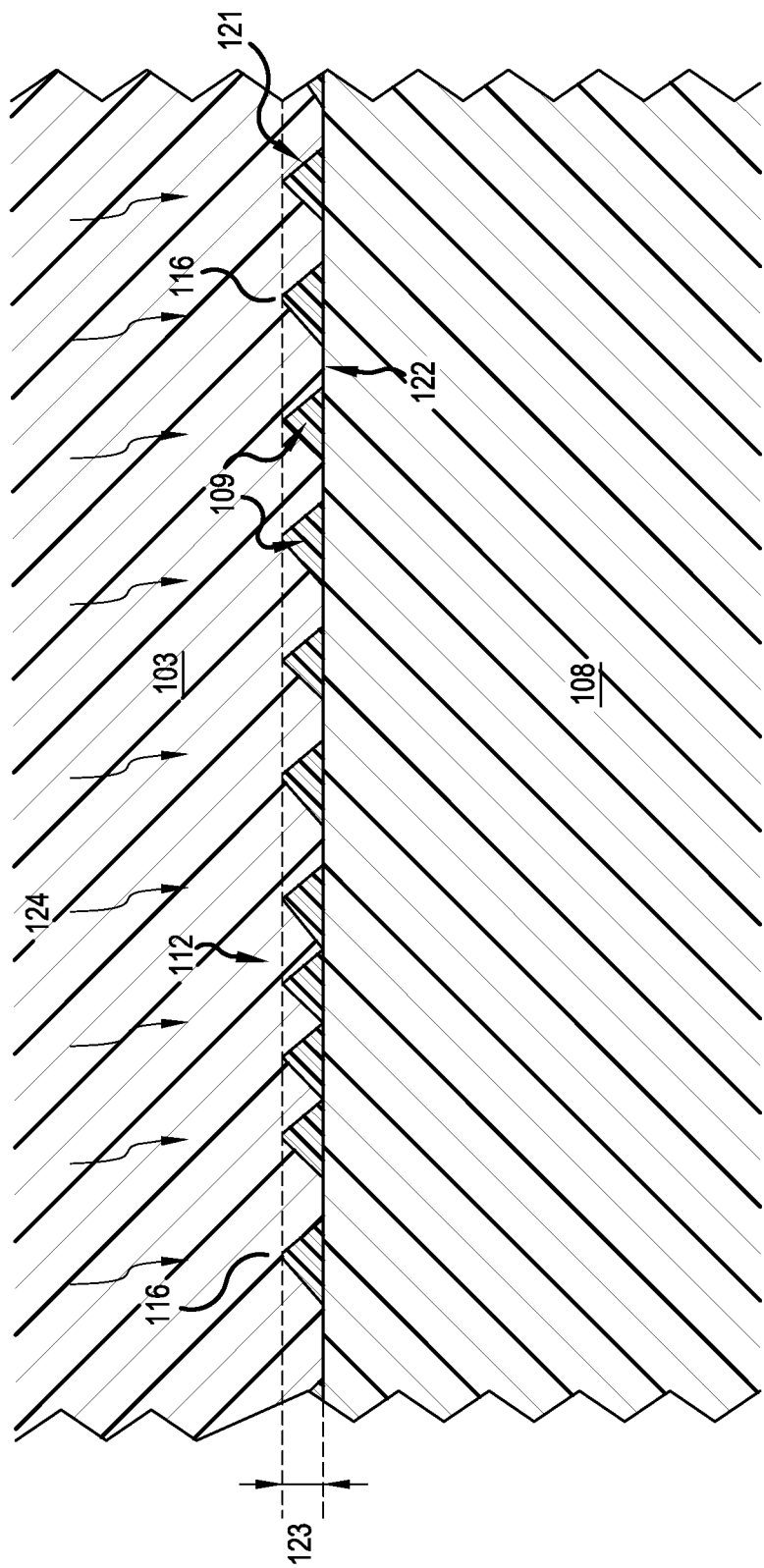
FIG. 1E is a cross-sectional view of a portion of a SAW resonator structure in accordance with a representative embodiment.

As noted above, the plurality of features 116 may be formed by etching the piezoelectric layer 103. In one embodiment, the piezoelectric layer 103 is substantially monocrystalline LT or LN that is etched using known wet or dry etching techniques. By way of example, an etch-resistant mask is selectively provided over the piezoelectric layer 103 and a wet etch is carried out, achieving some degree of selectivity. Illustratively, an etch resistant mask is patterned, and etching is effected by the use of an anisotropic etchant such as hydrofluoric acid (HF), or a mixture of HF and $HNO_3$. As noted above, the etching sequence used to form the plurality of features 116 in the piezoelectric layer 103 will result in the plurality of features 116 being less defined than, for example, the pyramids formed in the substrate as described in the parent application, but nonetheless defined enough to reveal sides 121 with slants and flat bottoms 122 as depicted in FIGS. 1D and 1E. Moreover, the depth of the etch, and therefore the height 123 of the plurality of features 116, is, of course, controlled by the duration of the etch. Therefore, the magnitude of the height 123 is beneficially well-controlled.

In one representative method, the etch mask is patterned to provide "dots" in rather random locations over the second surface 111 of the piezoelectric layer 103. Illustratively, the "dots" are resistant to a dry-etchant used in a dry-etching technique, such as an inductively-coupled plasma etching technique, known to one of ordinary skill in the art. After etching, these "dots" are removed, and show the flat bottoms 122 of certain ones of the plurality of features 116. The spacing of the "dots" and the duration of the etch determines the depth of each etch, and therefore, the height 123 of the resultant plurality of features 116.

Again, the use of monocrystalline LT or LN for the piezoelectric layer 103 is merely illustrative, and other materials can be processed to provide the plurality of features 116 described above.

In other representative embodiments, the plurality of features 116 has random spacing, or random orientation, or random heights, or a combination thereof. The random aspect of the orientation of the plurality of features 116 can result from a fabrication step, or from the unpolished wafer comprising the piezoelectric layer 103. As can be appreciated, such random spacings, orientations and heights, alone or in combination can foster comparatively diffuse reflection of the acoustic waves 124 incident thereon. This diffuse reflection, in turn, alters the phase of the acoustic waves 124, and serves to reduce the propensity of standing waves (and thus spurious modes) from being established.

The random spacing, orientation, and heights of the plurality of features 116 can be affected by a number of methods. For example, the plurality of features 116 may be provided by simply using an unpolished wafer comprising the piezoelectric layer 103. Alternatively, the second surface 115 of the piezoelectric layer 103 could be rough polished by CMP, for example, or grinded, or otherwise etched in a random manner. While the plurality of features 116 of such an embodiment would likely not have the height relative to the wavelength of the spurious modes, the random nature of such an unpolished surface would likely provide a useful degree of diffusive reflection to avoid the establishment of a resonant condition for the spurious modes.

FIG. 1E is a cross-sectional view of a portion of a SAW resonator structure according to a representative embodiment. Many aspects and details of the various features and their methods of fabrication described in connection with the representative embodiments of FIG. 1E are common to those described above in connection with the representative embodiments of FIGS. 1A-1D. Such common aspects and details are often not repeated in order to avoid obscuring the description of the present representative embodiments.

Notably, the portion depicted in FIG. 1E is somewhat similar to portion 118 depicted in FIG. 1D, however differs in the depth of the polishing step of the second surface 113 of the layer 109 used to provide first surface 112 of layer 109. Specifically, rather than terminating the polishing of the second surface 113 of the layer 109 at a height significantly above the plurality of features 116, the polishing step continues and in places reveals the plurality of features 116. This polishing step thus provides, in places, comparatively "flat" bottoms 122. By contrast, in other places, the plurality of features 116 are not altered by the polishing.

Like the plurality of features 116 depicted in FIG. 1D, the plurality of features 116 of the representative embodiments of FIG. 1E are formed by processing piezoelectric layer 103 by one of a number of methods, such as described above, or by providing an unpolished wafer comprising the piezoelectric layer 103. As noted above, using a known etching method for their formation, the resultant plurality of features 116 may have sides 121 that are on a "slant," and foster reflections at off-angles relative to the incident direction of the acoustic waves 124. Similarly, like the plurality of features 116 of FIG. 1D, the height 123 of the plurality of features 116 of the representative embodiments of FIG. 1E is approximately one-fourth (¼) λ of one or more of the spurious modes. Selecting the height 123 of the plurality of features 116 to be approximately one-fourth (¼) λ of a particular spurious mode alters the phase of the reflected waves, and results in destructive interference by the reflected waves, and substantially prevents the establishment of standing waves, and thus spurious modes.

In some embodiments, the height 123 of the plurality of features 116 is substantially the same, and thus the height 123 is selected to be approximately one-fourth (¼) λ of one (e.g., a predominant) spurious mode. In other embodiments, the height 123 of the plurality of features 116 is not the same, but rather each different height is selected to be approximately equal to one-fourth (¼) λ of one of the multiple spurious modes (e.g., one of the spurious modes 107 depicted in FIG. 1B). By selecting such multiple heights, the phase of the reflected waves is altered, which results in destructive interference by the reflected waves, thereby substantially preventing the establishment of standing waves of multiple frequencies, thus preventing the establishment of multiple spurious modes.

In other representative embodiments, the plurality of features 116 have random spacing, or random orientation, or random heights, or a combination thereof. As can be appreciated, such random spacings, orientations and heights, alone or in combination can foster comparatively diffuse reflection of the acoustic waves 124 incident thereon. This diffuse reflection, in turn, alters the phase of the acoustic waves 124, and serves to reduce the propensity of standing waves (and thus spurious modes) from being established.

The random spacing, orientation, and heights of the plurality of features 116 can be affected by a number of methods. For example, the plurality of features 116 may be provided by simply using an unpolished wafer for piezoelectric layer 103. Alternatively, the second surface 111 of the piezoelectric layer 103 could be rough polished by CMP, for example. While the plurality of features 116 of such an embodiment would likely not have the height relative to the wavelength of the spurious modes, the random nature of such an unpolished surface would likely provide a useful degree of diffusive reflection to avoid the establishment of a resonant condition for the spurious modes.

In yet another embodiment, the SAW resonator structure may have multiple layers formed of oxide material (e.g., PSG), like layer 109, which may be referred to as first and second oxide layers. The multiple oxide layers are arranged adjacent to one another between the substrate (108) and the piezoelectric layer (103). For example, a first oxide layer may be disposed on a roughened first surface of the substrate (108), where the first oxide layer has a polished first (upper) surface and a non-uniform second (lower) surface filling spaces between features defined by a roughened first surface of the substrate (108). A second oxide layer may be disposed between the polished first surface of the first oxide layer and a roughened lower surface of the piezoelectric layer (103), where the second oxide layer has a polished second (lower) surface in contact with the polished first surface of the first oxide layer and has a non-uniform first (upper) surface filling spaces between features defined by the roughened second surface of the piezoelectric layer (103). Similar to the discussion above, the polished first surface of the first oxide layer and the polished second surface of the second oxide layer each have a smoothness sufficient to foster atomic bonding between the polished first surface of the first oxide layer and the polished second surface of the second oxide layer. The bond strength realized by the atomic bonding is directly proportional to the contact area between the polished surfaces of the first and second oxide layers, thereby improving the bond of the first and second oxide layers.

FIG. 1F is a cross-sectional view of a portion 117 of SAW resonator structure 100 according to a representative embodiment. Portion 117 is depicted in FIG. 1F in magnified view to illustrate various aspects and functions of the layer 109 along the interface of the layer 109 and the substrate 108.

In a representative embodiment, the layer 109 is an oxide material layer, such as PSG, which is deposited over the piezoelectric layer 103. Illustratively, the PSG is deposited at a temperature of approximately 450° C., using silane and $P_2O_5$ sources to form a soft glass like material which is approximately 8% phosphorous. This low temperature process is well known to those skilled in the art, and hence, will not be discussed in detail here.

Unfortunately, at the atomic level the surfaces of such deposited films are atomically very rough. However, the second surface 113 of layer 109 (e.g., PSG) can be polished by a known method to provide an atomically smooth surface. The surface of the layer 109 is first planarized by polishing with a slurry, using a known CMP method. The remaining PSG can then be polished using a more refined slurry. Alternatively, a single more refined slurry can be used for both polishing steps if the additional polishing time is not objectionable. As noted above, the goal is to create a "mirror" like finish that is atomically smooth in order to foster strong atomic bonding between the layer 109 and the substrate 108, at the interface of their second and first surfaces 113, 114 respectively. Further details of the polishing sequence can be found, for example, in U.S. Pat. No. 6,060,818 and U.S. Patent Application Publication 20050088257, to Ruby et al. The entire disclosures of U.S. Pat. No. 6,060,818, and U.S. Patent Application Publication 2005/0088257 are specifically incorporated herein by reference.

FIG. 1F depicts four "humps" 125 in the layer 109 after the completion of the cleaning of the wafer to remove remnants of the CMP process, as described, for example, in above-incorporated U.S. Pat. No. 6,060,818 and U.S. Patent Application Publication 2005/0088257 to Ruby, et al. The "humps" 125 depict variation in the second surface 113 of the layer 109. The first hump has a first height, $H_1$, the second hump has a second height, $H_2$, the third hump has a third height, $H_3$, and the fourth hump has a fourth height, $H_4$. For the purposes of illustration, only four humps 125 are shown. The root mean squared (RMS) variation in the height of the second surface 113 of the layer 109 comprised of the four humps 125 depicted is less than approximately 5.0 Å. As noted above, the term "atomically smooth" herein means sufficiently smooth to provide sufficient contact area to provide a sufficiently strong bond strength between the layer 109 and the substrate 108, at the interface of their second and first surfaces 113, 114, respectively. Such an atomically smooth surface can be realized by providing the second surface 113 of layer 109 having an RMS variation in height of in the range of approximately 0.1 Å to approximately 10.0 Å; although beneficially, the RMS variation in height is less than approximately 5.0 Å.

As noted above, the forming of an atomically smooth second surface 113 provides an increased contact area at the interface of the second and first surfaces 113, 114, respectively, of the layer 109 and the substrate 108. This increased contact area, in turn, fosters a comparatively strong atomic bond between the layer 109 and the substrate 108. Among other benefits, the strong atomic bond between the layer 109 and the substrate 108 reduces separation or delamination of the layer 109 and the substrate 108, thereby increasing the reliability of devices comprising the SAW resonator structure 100 over time.

Figure 2:
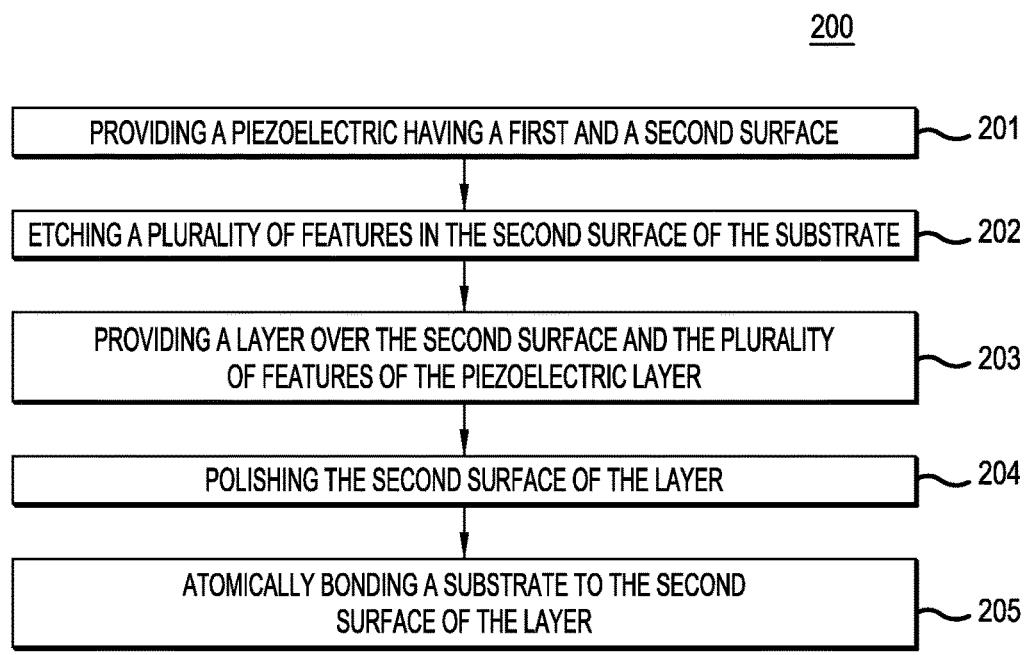
FIG. 2 is a flow-chart of a method of fabricating a SAW resonator structure according to a representative embodiment.

FIG. 2 is a flow-chart of a method 200 of fabricating a SAW resonator structure according to a representative embodiment. Many aspects and details of the method, including illustrative materials, processes, and dimensions are common to those described above. These aspects and details may not be repeated to avoid obscuring the presently described representative embodiment.

At 201, the method begins with providing a piezoelectric layer having a first surface and a second surface. As noted above, among other materials, the piezoelectric layer (e.g., piezoelectric layer 103) may be monocrystalline LT or LN.

At 202, a plurality of features (e.g., plurality of features 116) are etched into the piezoelectric layer 103.

At 203, a layer is provided over a second surface of the piezoelectric layer, which comprises the plurality of features. As noted above, the layer (e.g., layer 109) may be an oxide (glass), such as $SiO_2$ or PSG.

At 204, a second surface (e.g., 113) of the layer is polished to provide a comparatively smooth second surface. As noted above a CMP method may be used to provide a first surface that is atomically smooth to foster a strong atomic bond between the layer (e.g. layer 109) and the substrate (e.g. substrate 108).

At 205, the method comprises atomically bonding the layer to the first surface of the substrate. Notably, this bonding comprises contacting the substrate (e.g., substrate 108) with the layer (e.g., layer 109) that has been polished to an atomically smooth degree.

As noted above, when connected in a selected topology, a plurality of SAW resonators can function as an electrical filter. FIG. 3 shows a simplified schematic block diagram of an electrical filter 300 in accordance with a representative embodiment. The electrical filter 300 comprises series SAW resonators 301 and shunt SAW resonators 302. The series SAW resonators 301 and shunt SAW resonators 302 may each comprise SAW resonator structures 100 described in connection with the representative embodiments of FIGS. 1A-2. As can be appreciated, the SAW resonator structures (e.g., a plurality of SAW resonator structures 100) that comprise the electrical filter 300 may be provided over a common substrate (e.g., substrate 108), or may be a number of individual SAW resonator structures (e.g., SAW resonator structures 100) disposed over more than one substrate (e.g., more than one substrate 108). The electrical filter 300 is commonly referred to as a ladder filter, and may be used for example in duplexer applications. It is emphasized that the topology of the electrical filter 300 is merely illustrative and other topologies are contemplated. Moreover, the acoustic resonators of the representative embodiments are contemplated in a variety of applications including, but not limited to duplexers.

As discussed above, conventional dies are generally capable of supporting circuitry, including acoustic resonators, such as SAW resonators and corresponding filters, for a single duplexer for transmitting and receiving singles in a predetermined frequency band. More than one duplexer (or, more than two acoustic filters) on a conventional substrate produces a larger die, typically resulting in mechanical stresses on the substrate (or other components of the SAW resonators) that will likely to crack the die upon assembly. However, according to various embodiments, at least three acoustic filters and/or at least two duplexers may be arranged on a single die having the structure described above with reference to FIGS. 1A-2. Each acoustic filter may include one of a transmit filter or a receive filter corresponding to a predetermined frequency band.

Figure 6:
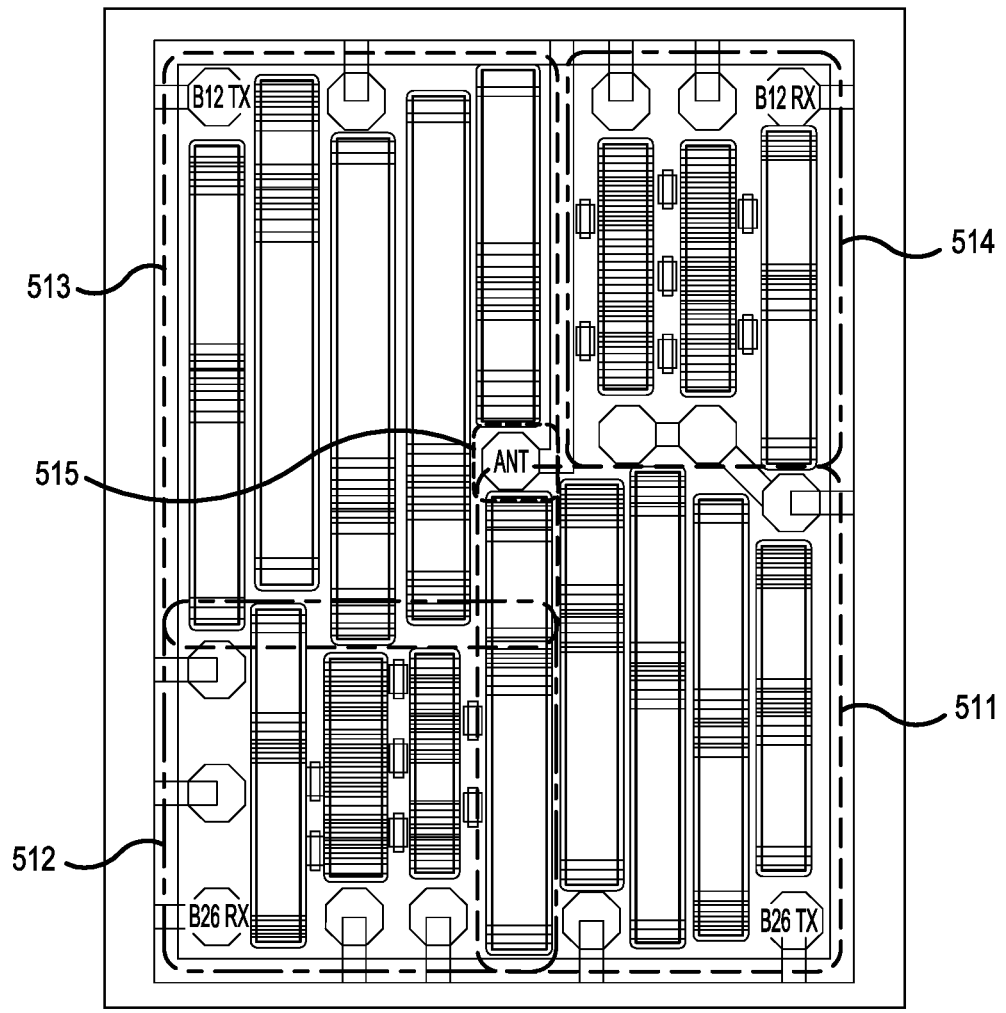
FIG. 6 is a top plan view of the transmit and receive SAW resonator filters, depicted in FIGS. 4A and 4B, integrated into a single die and depicted in corresponding regions, according to a representative embodiment.

FIGS. 4A and 4B are top plan views of conventional duplexers, including transmit and receive SAW resonator filters on conventional dies, for sending and receiving signals in different frequency bands (i.e., band B26 and band B12), respectively. FIGS. 5 and 6 are top plan view of the transmit and receive SAW resonator filters, depicted in FIGS. 4A and 4B, integrated into a single die, according to a representative embodiment.

Figure 7:
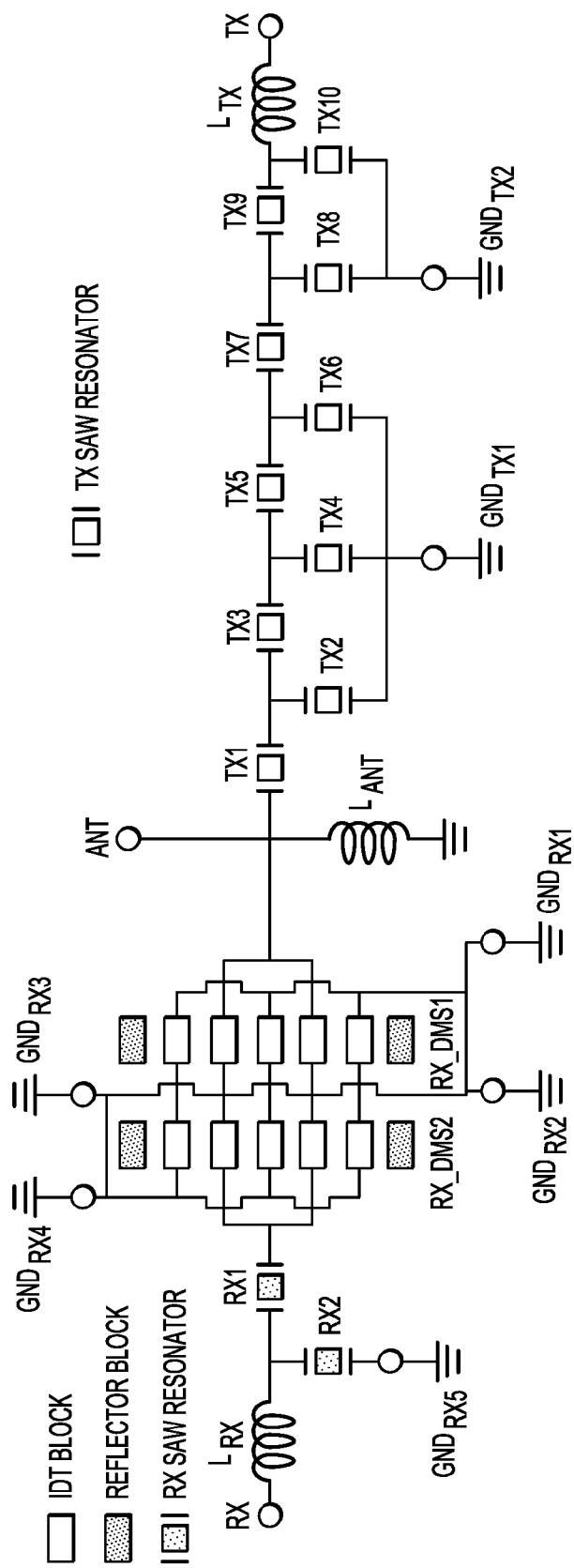
FIG. 7 is a simplified block diagram of an illustrative duplexer including SAW resonator filters in half-ladder configuration.

Referring to FIG. 4A, a first duplexer 401 includes a transmit acoustic filter 410 and a receive acoustic filter 430 for band pass filtering transmitted and received signals in band B26, for example. The first duplexer 401 is arranged on a conventional first die 405, as discussed above, and includes an antenna port 408 for accessing an antenna (not shown) for passing the transmitted and received signals. The transmit acoustic filter 410 includes representative acoustic resonators TX411, TX412, TX413, TX414, TX415, TX416, TX417, TX418, TX419 and TX420, and the receive acoustic filter 430 includes representative acoustic resonators RX431, RX432, RX433 and RX434. In the depicted example, the acoustic resonators TX411 to TX420 and the acoustic resonators RX431 to RX432 are SAW resonators, and the acoustic resonators RX433 and RX444 are dual mode SAW (DMS) resonators. The DMS resonators may include dual tracks of IDTs arranged between pairs of reflectors, examples of which are shown in FIG. 7 (e.g., RX_DMS1 and RX DMS2).

Similarly, referring to FIG. 4B, a second duplexer 402 includes a transmit acoustic filter 450 and a receive acoustic filter 470 for band pass filtering transmitted and received signals in band 12, for example. The second duplexer 402 is arranged on a conventional second die 406, as discussed above, and includes an antenna port 409 for accessing an antenna (not shown) for passing the transmitted and received signals. The transmit acoustic filter 450 includes representative acoustic resonators TX451, TX452, TX453, TX454, TX455, TX456, TX457, TX458, TX459 and TX460, and the receive acoustic filter 470 includes representative acoustic resonators RX471, RX472, RX473 and RX474. In the depicted example, the acoustic resonators TX451 to TX4620 and the acoustic resonators RX471 to RX472 are SAW resonators, and the acoustic resonators RX473 and RX474 are DMS resonators.

According to design rules, the first and second duplexers 401 and 402 each must have a certain minimum margin around the perimeter of the first and second dies 405 and 406, e.g., for assembly a die into a module, in which no acoustic resonator and associated circuitry may be located. Also, the transmit acoustic filters 410, 450, the receive acoustic filters 430, 470 and the various ports, including the antenna ports 408, 409 leave substantially unused (wasted) space on the surfaces of the first and second dies 405 and 406, indicated by the blank portions. Likewise, as discussed above, both of the first and second duplexers 401 and 402 have corresponding "keep out" regions, respectively, to accommodate the matching circuits buried under the first and second dies 405 and 406. The "keep out" regions increase the size the filter regions, and therefore the corresponding first and second dies 405 and 406. Also, since there are two duplexers 401 and 402 on two separate dies 405 and 406, the aggregate "keep out" region of the electronic device is doubled.

Referring to FIG. 5, the first and second duplexers 401 and 402 are integrated onto a single die, indicated as representative single die 505, which has the structure described above with reference to FIGS. 1A-2. For example, the die 505 includes a substrate (108), an oxide layer (109) and a piezoelectric layer (103), where the piezoelectric layer has a roughened second surface to which a first surface of the oxide layer is joined (filling features formed by the roughened second surface of the piezoelectric layer), and where the substrate has a polished first surface to which a polished second surface of oxide layer is atomically bonded. The die 505 therefore has the structural integrity and strength to support more than one duplexer with associated acoustic filters (e.g., first duplexer 401 or second duplexer 402). In other words, more than two (at least three) acoustic filters may be formed on the die 505 without stressing the substrate, for example, that may result in cracks or other damage. The 505 is able to support multiplexers of various sizes (e.g., triplexers, quadplexers, quintplexers, etc., as well as duplexers) having numerous transmit and/or receive acoustic filters and acoustic resonators.

Also, when a single antenna port is provided, such as antenna port 508, for all of the acoustic filers, only one matching circuit is required, and thus only one "keep out" region. The fewer "keep out" regions required, the smaller the surface area of the die 505 may be. Further, only one margin is needed for around the perimeter of the die 505, thereby avoiding duplicate margins for the same number of acoustic filers.

More particularly, FIG. 5 depicts an example of a Quadplexer Integrated into a Single Chip (QISC) 501 formed on the single die 505 (or simply a Quadplexer). Again, for purposes of illustration, the QISC 501 is designed to accommodate simultaneously transmission and reception of RF signals in LTE band B26 and LTE band B12, although other types of bands may be incorporated without departing from the scope of the present teachings. For example, the QISC 501 may be configured to accommodate simultaneously transmission and reception of RF signals in LTE band B8 (uplink frequency band of 880 MHz-915 MHz and downlink frequency band of 925 MHz-960 MHz) and LTE band B20 (uplink frequency band of 832 MHz-862 MHz and downlink frequency band of 791 MHz-821 MHz), in LTE band B20 and LTE band B28A (uplink frequency band of 703 MHz-718 MHz and downlink frequency band of 758 MHz-773 MHz), or in LTE band B26 and LTE band B28B (uplink frequency band of 718 MHz-748 MHz and downlink frequency band of 773 MHz-803 MHz), which are commonly used for wireless telephones, although the disclosure is not limited to these combinations of different bands. Likewise, various numbers of bands (or filters corresponding to various RF uplink and/or downlink RF ranges) may be incorporated without departing from the scope of the present teachings, as discussed below. For example, for a triplexer configuration on a single die 505, the predetermined RF bands may include transmit and receive filters for LTE band B26 and a transmit or receive filter in LTE band B29 (downlink frequency band of 717 MHz-728 MHz), or transmit and receive filters for LTE band B12 and a transmit or receive filter in LTE band B71 (uplink frequency band of 663 MHz-698 MHz and downlink frequency band of 617 MHz-652 MHz).

QISC 501 includes a transmit acoustic filter 410 and a receive acoustic filter 430 for band pass filtering transmitted and received signals in band B26, a transmit acoustic filter 450 and a receive acoustic filter 470 for band pass filtering transmitted and received signals in band B12, for example, and a common antenna port 508 for communicating with a common antenna (not shown). In alternative configurations, there may be more than one antenna port connected to more than one antenna, respectively, as the number of antenna ports and/or antennas may vary to provide unique benefits for any particular situation or to meet application specific design requirements of various implementations, as would be apparent to one skilled in the art. In the depicted embodiment, a shunt inductance (not shown) is connected between the antenna port 508 and ground, where the shunt inductance provides impedance matching between the antenna port 508 and each of the transmit acoustic filters 410, 450 and each of the receive acoustic filters 430, 470 connected to the antenna port 508. As stated above, since there is only one impedance matching circuit, e.g., shunt inductance (when there is one antenna port 508), there likewise is only one "keep out" region for four filters (as opposed to two or four "keep out" regions). Generally, a value of the shunt inductance connected to the antenna port 508 of the single die 505 is less than a value of each of a first shunt inductance connected to the (first) antenna port 408 on the separate first die 405 and a second shunt inductance connected to the (second) antenna port 409 on the separate second die 406, if the first and second duplexers 401 and 402 were arranged on the first and second dies 405 and 406, respectively.

In the example depicted in FIG. 5, the antenna shunt inductance has value of about 5.5 nH. Also, each of the transmit acoustic filters 410, 450 and each of the receive acoustic filters 430, 470 has a corresponding series inductance (not shown) connected in series with the antenna port 508. In the present example, the transmit acoustic filter 410 (band B26) includes a series inductance having a value of about 4.0 nH, the receive acoustic filter 430 (band B26) includes a series inductance having a value of about 24.0 nH, the transmit acoustic filter 450 (band B12) includes a series inductance having a value of about 1.0 nH, and the receive acoustic filter 470 (band B12) includes a series inductance having a value of about 0.0 nH. Of course, the values of the series inductances may vary depending on a variety of factors, including the value of the antenna shunt inductance, and the number and frequency bands of the transmit and receive acoustic filters, for example, as would be apparent to one skilled in the art.

Also, as discussed above, each of the acoustic resonators (assuming SAW resonators) includes a plurality of electrodes is disposed over the first surface of the piezoelectric layer (103). The electrodes are configured to generate surface acoustic waves in the piezoelectric layer. In the example depicted in FIG. 5, the electrodes of the transmit acoustic filter 410 and the receive acoustic filter 430 (band B26) are formed of aluminum at a thickness of about 4500 Å, and the electrodes of the transmit acoustic filter 450 and the receive acoustic filter 470 (band B12) are formed of aluminum at a thickness of about 5300 Å, for example. Alternatively, the electrodes may be formed at other thicknesses and/or of other electrically conductive materials, such as tungsten (W), iridium (Ir), molybdenum (Mo), gold (Au), platinum (Pt), ruthenium (Ru), niobium (Nb), and/or hafnium (Hf), for example, without departing from the scope of the present teachings.

The transmit acoustic filter 410 includes representative acoustic resonators TX411, TX412, TX413, TX414, TX415, TX416, TX417, TX418, TX419 and TX420. In the depicted embodiment, as shown in FIG. 6, the acoustic resonators TX411-TX420 are grouped within a first region 511 on the surface of the die 501, the first region 511 being indicated by dashed lines. The receive acoustic filter 430 includes representative acoustic resonators RX431, RX432, RX433 and RX 434, where RX433 and RX434 are DMS resonators. The acoustic resonators RX431-RX434 are grouped within a second region 512 on the surface of the die 501, indicated by dashed lines, which is adjacent to the first region 511. Further, the acoustic resonators TX451-TX460 are grouped within a third region 513 on the surface of the die 501, indicated by dashed lines. The receive acoustic filter 470 includes representative acoustic resonators RX471, RX472, RX473 and RX 474, where RX473 and RX474 are DMS resonators. The acoustic resonators RX471-RX474 are grouped within a fourth region 514 on the surface of the die 501, indicated by dashed lines, which is adjacent to the third region 513. The antenna 508 is located in a fifth region 515, which also includes the matching circuit, e.g., shunt inductor (not shown). The fifth region 515 may be substantially centered among the first through fourth regions 511-514 of the singe die 505.

Generally, the areas (sizes) of the first through fourth regions 511-514 are determined by the number of acoustic resonators in the respective transmit and receive acoustic filters 410, 430, 450 and 470, respectively, occupying the areas. In the depicted embodiment, the acoustic resonators TX411-TX420 are arranged on the die 505 to minimize the area of the first region 511; the acoustic resonators RX431-RX434 are arranged on the die 505 to minimize the area of the second region 512; the acoustic resonators TX451-TX460 are arranged on the die 505 to minimize the area of the third region 513; and the acoustic resonators RX471-RX474 are arranged on the die 505 to minimize the area of the fourth region 514. Also, the first through fourth regions 511 to 514 may be arranged in relation to one another to further minimize the surface area of the die 505. For example, in the depicted embodiment, the acoustic resonators TX411-TX420 of the transmit acoustic filter 410, which is relatively long, is positioned below (as oriented on the page) the acoustic resonators RX471-RX474 of the receive acoustic filter 470, which is relatively short. Likewise, the acoustic resonators TX451-TX460 of the transmit acoustic filter 450, which is relatively long, is positioned above (as oriented on the page) the acoustic resonators RX431-RX434 of the receive acoustic filter 430, which is relatively short. This arrangement further reduces length of the die 505, preventing unused space. Of course the relative arrangements of the acoustic resonators and corresponding regions on the die is influenced by the number, types and sizes of the acoustic resonators.

FIG. 7 is a simplified block diagram of a duplexer including SAW resonator filters in half-ladder configuration, for purposes of illustration. The duplexer configuration depicted in FIG. 7 may be used to accommodate uplink and downlink signals in different frequency bands, including representative band 26 shown in FIG. 4A and representative band 12 shown in FIG. 4B, although the duplexer configuration, and variations thereof, may be incorporated for use with other frequency bands, as well. It is thus understood that the duplexer configuration depicted in FIG. 7 is for illustrative purposes, and is not intended to be limiting with regard to the various types of multiplexers that may be integrated into a single die, such as die 505, according to various embodiments.

Referring to FIG. 7, the duplexer includes a five-stage (ten-pole) half ladder transmit (TX) filter that includes series SAW resonators TX1, TX3, TX5, TX7 and TX9 connected in series with inductor $L_{TX}$ between transmitter port TX and antenna port ANT. The half ladder TX filter further includes shunt SAW resonators TX2, TX4, TX6, TX8 and TX10 connected between various adjacent series SAW resonators and ground ($GND_{TX1}$, $GND_{TX2}$). The representative duplexer also includes a two-track, five-IDT DMS and one-stage half ladder receive (RX) filter that includes series SAW resonator RX1, RX_DMS1 and RX_DMS2 connected in series with inductor $L_{RX}$ between receiver port RX and antenna port ANT. The half ladder RX filter further includes shunt SAW resonator RX2 connected between the series SAW resonator RX1 and the inductor $L_{RX}$ and ground ($GND_{RX5}$). Each of the RX_DMS1 and RX_DMS2 includes five IDTs arranged between two reflectors, and has multiple ground connections ($GND_{RX1}$, $GND_{RX2}$, $GND_{RX3}$, $GND_{RX4}$). The antenna port ANT is connected to a matching circuit, indicated by inductor $L_{ANT}$ connected between the antenna port ANT and ground.

As stated above, the duplexer topology depicted in FIG. 7 may be used to accommodate uplink and downlink signals in different frequency bands. For example, referring to FIG. 4A (depicting band 26 topology) and FIG. 7, the acoustic resonators TX411, TX412, TX413, TX414, TX415, TX416, TX417, TX418, TX419 and TX420 of the transmit acoustic filter 410 respectively correspond to SAW resonators TX1, TX2, TX3, TX4, TX5, TX6, TX7, TX8, TX9 and TX10 of the five-stage half ladder TX filter, acoustic resonators RX431 and RX432 in the receive acoustic filter 430 respectively correspond to SAW resonators RX1 and RX2 of the one-stage half ladder RX filter, and acoustic resonators RX433 and RX434 also in the receive acoustic filter 430 respectively correspond to the two-track, five-IDT RX_DMS1 and RX_DMS2. Further, for band 26, the shunt inductor $L_{ANT}$ may have a value of about 9.2 nH (Q=20), the series inductor $L_{TX}$ may have a value of about 4 nH (Q=20), and the series inductor $L_{RX}$ may have a value of about 3.7 nH (Q=20), for example, although other frequency bands (e.g., band 12) and/or values may be incorporated without departing from the scope of the present teachings.

Generally, integrating the acoustic filters from multiple dies into a single die, capable of supporting at least three acoustic filters, e.g., due to the inclusion of oxide layer(s) attached to roughened surfaces of a piezoelectric layer and/or substrate, and atomic bonding of the oxide layer(s) with the substrate (or with one another), as discussed above, provides a number of advantages. For example, the integration shrinks the overall area on the PCB of the wireless device required for a multiplexer. That is, a surface area of the single die 505, on which the transmit acoustic filters 410, 450 and receive acoustic filters 430, 470 are arranged, is less than a sum of a first surface area of the first die 405 and a second surface area of the separate second die 406, if the transmit acoustic filters 410, 450 and receive acoustic filters 430, 470 were arranged as the first and second duplexers 401, 402 on the first and second dies 405, 406, respectively (as shown in FIGS. 4A and 4B). Also, with fewer dies, the number of RF tests is reduced, as well as T&R. That is, with only the single die, all RF testing can be done in one touch down, and if found to be "good," the single die goes into one T&R. This results in a significant savings in test time and T&R slots.

Assembly is simplified when mounting a single die that includes the integrated multiplexer with more than two acoustic filters, as opposed to mounting multiple dies (with a larger aggregate surface area). For example, assembly is simplified when mounting one QISC, as compared to four FBAR filters or two SAW resonator duplexers integrated in a single chip (DISC). Furthermore, due to the combination of multiple filters into a single die, the number of die edges is reduced from 16 edges (i.e., four dies with four edges apiece) to simply four edges. "Tiling" of the acoustic filters may also be accomplished for further efficiencies in packing. Thus, the total area for accommodating die(s) is significantly reduced, since only one die is in place.

As mentioned above, the QISC depicted in FIGS. 4A-6 is an example of a multiplexer with more than two acoustic filters integrated into one die. However, variations may include any various types of multiplexers including various numbers of filters, such as three filters integrated into a single chip (triplexer or "TISCS"), five filters integrated into a single chip (quintplexer or "PISCS"), six filters integrated into a single chip (hexplexer or "HISCS") and so on, for example.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A multiplexer device, comprising:
   a single die;
   a first duplexer arranged on the single die, comprising:
   a first transmit filter corresponding to a first predetermined radio frequency (RF) band and comprising a plurality of first transmit acoustic resonators grouped in a first region of the single die; and
   a first receive filter corresponding to the first predetermined RF band and comprising a plurality of first receive acoustic resonators grouped in a second region of the single die adjacent to first region;
   a second duplexer arranged on the single die, comprising:
   a second transmit filter corresponding to a second predetermined RF band and comprising a plurality of second transmit acoustic resonators grouped in a third region of the single die; and
   a second receive filter corresponding to a second predetermined RF band and comprising a plurality of second receive acoustic resonators grouped in a fourth region of the single die adjacent to the third region; and
   at least one antenna port arranged on the single die and connected to at least one antenna, respectively, wherein each of the at least one antenna port is further connected to at least one of the first and second duplexers arranged on the single die, and is configured to pass RF signals corresponding to at least one of the first and second predetermined RF bands.

2. The multiplexer device of claim 1, wherein the single die comprises:
   a substrate having a polished upper surface;
   a piezoelectric layer disposed over the substrate, the piezoelectric layer having an roughened lower surface; and
   an oxide layer disposed between the polished upper surface of the substrate and the roughened lower surface of the piezoelectric layer, the oxide layer having a polished lower surface in contact with the polished upper surface of the substrate and having an upper surface filling spaces between features defined by the roughened lower surface of the piezoelectric layer,
   wherein the polished upper surface of the substrate and the polished lower surface of the oxide layer each have a smoothness sufficient to foster atomic bonding between the polished upper surface of the substrate and the polished lower surface of the oxide layer.

3. The multiplexer device of claim 2, wherein the piezoelectric layer comprises one of lithium tantalate (LT) or lithium niobate (LN).

4. The multiplexer device of claim 2, wherein each of the first and second transmit acoustic resonators and each of the first and second receive acoustic resonators is disposed on the piezoelectric layer, is configured to generate surface acoustic waves, and comprises an interdigitated transducer (IDT).

5. The multiplexer device of claim 1, wherein the single die comprises:
   a substrate having a roughened upper surface;
   a first oxide layer disposed on the roughened upper surface of the substrate, the first oxide layer having a polished upper surface and having a lower surface filling spaces between features defined by the roughened upper surface of the substrate;
a piezoelectric layer disposed over the substrate and the first oxide layer, the piezoelectric layer having a roughened lower surface; and
a second oxide layer disposed between the polished upper surface of the first oxide layer and the roughened lower surface of the piezoelectric layer, the second oxide layer having a polished lower surface in contact with the polished upper surface of the first oxide layer and having an upper surface filling spaces between features defined by the roughened lower surface of the piezoelectric layer,
wherein the polished upper surface of the first oxide layer and the polished lower surface of the second oxide layer each have a smoothness sufficient to foster atomic bonding between the polished upper surface of the first oxide layer and the polished lower surface of the second oxide layer.

6. The multiplexer device of claim 1, wherein each of the first and second transmit acoustic resonators, and the first and second receive acoustic resonators is a surface acoustic wave (SAW) resonator.

7. The multiplexer device of claim 1, wherein the first predetermined RF band is LTE band B12, and the second predetermined RF band is LTE band B26.

8. The multiplexer device of claim 1, wherein the first predetermined RF band is LTE band B8, and the second predetermined RF band is LTE band B20.

9. The multiplexer device of claim 1, wherein the first predetermined RF band is LTE band B20, and the second predetermined RF band is one or LTE band B28A.

10. The multiplexer device of claim 1, wherein the first predetermined RF band is LTE band B26, and the second predetermined RF band is LTE band B28B.

11. The multiplexer device of claim 1, further comprising a shunt inductance connected between each of the at least one antenna port and ground, wherein the shunt inductance provides impedance matching between each of the at least one antenna port and each of the at least one of the first and second duplexers connected to the at least one antenna port.

12. The multiplexer device of claim 1, wherein one of the at least one antenna port is arranged in a fifth region of the single die.

13. A multiplexer device, comprising:
a single die, comprising:
a substrate having an upper surface;
an oxide layer disposed on the upper surface of the substrate, the oxide layer having a polished lower surface, wherein the polished lower surface has a smoothness sufficient to foster atomic bonding with the upper surface of the substrate; and
a piezoelectric layer disposed on the oxide layer, the piezoelectric layer having a roughened lower surface, wherein an upper surface of the oxide layer fills spaces between features of the roughened lower surface of the piezoelectric layer;
a plurality of acoustic resonators disposed over the piezoelectric layer of the single die and configured to generate surface acoustic waves in the piezoelectric layer, the plurality of acoustic resonators forming at least three acoustic filters, wherein each acoustic filter comprises one of a transmit filter or a receive filter corresponding to a predetermined radio frequency (RF) band;
an antenna port arranged on the single die and connected to an antenna, the antenna port being configured to pass RF signals corresponding to the predetermined RF band to which each of the at least three acoustic filters corresponds; and
a shunt inductance connected between the antenna port and ground, the shunt inductance being configured to provide impedance matching between the antenna port and each of the at least three acoustic filters.

14. The multiplexer device of claim 13, wherein the at least three acoustic filters comprise four acoustic filters arranged on the single die, forming a quadplexer.

15. The multiplexer device of claim 14, wherein the quadplexer comprises:
a first duplexer comprising a first transmit filter and a first receive filter corresponding to a first predetermined RF band, and
a second duplexer comprising a second transmit filter and a second receive filter corresponding to a second predetermined RF band.

16. The multiplexer device of claim 13, wherein the at least three acoustic filters comprise:
a first filter corresponding to a first predetermined RF band,
a second filter corresponding to the first predetermined RF band, and
one or more additional filters corresponding to at least one additional predetermined RF band.

17. The multiplexer device of claim 16, wherein the first predetermined RF band is LTE band B26, and the at least one additional predetermined RF band is LTE band B29, or
wherein the first predetermined RF band is LTE band B12, and the at least one additional predetermined RF band is LTE band B71.

18. The multiplexer device of claim 13, wherein the at least three acoustic filters comprise:
at least one first filter corresponding to a first predetermined RF band, the at least one first filter comprising a plurality of first acoustic resonators; and
at least one second filter corresponding to a second predetermined RF band, the at least one second filter comprising a plurality of second acoustic resonators.

19. The multiplexer device of claim 18, wherein the at least three acoustic filters further comprise:
at least one third filter corresponding to a third predetermined RF band, the at least one third filter comprising a plurality of third acoustic resonators.

20. A multiplexer device, comprising:
a single die;
a plurality of acoustic filters arranged on the single die, comprising:
a first transmit filter corresponding to a first predetermined radio frequency (RF) band, the first transmit filter comprising a plurality of first transmit acoustic resonators grouped in a first region of the single die;
a first receive filter corresponding to the first predetermined RF band, the first receive filter comprising a plurality of first receive acoustic resonators grouped in a second region of the single die adjacent to first region;
a second transmit filter corresponding to a second predetermined RF band, the second transmit filter comprising a plurality of second transmit acoustic resonators grouped in a third region of the single die; and
a second receive filter corresponding to the second predetermined RF band, the second receive filter comprising a plurality of second receive acoustic resonators grouped in a fourth region of the single die adjacent to the third region;

an antenna port arranged on the single die and connected to an antenna, the antenna port being configured to pass RF signals corresponding to the first and second predetermined RF bands; and a shunt inductance connected between the antenna port and ground, and the shunt inductance being configured to provide impedance matching between the antenna port and each of the plurality of acoustic filters.

21. The multiplexer device of claim 20, wherein each of the first and second transmit acoustic resonators, and the first and second receive acoustic resonators is a surface acoustic wave (SAW) resonator.

22. The multiplexer device of claim 20, wherein the antenna port is arranged on a fifth region of the single die, substantially centered among the first, second, third and fourth regions of the single die.

* * * * *

UNITED STATES PATENT AND TRADEMARK OFFICE
CERTIFICATE OF CORRECTION

PATENT NO. : 10,469,056 B2
APPLICATION NO. : 15/639124
DATED : November 5, 2019
INVENTOR(S) : Richard C. Ruby et al.

It is certified that error appears in the above-identified patent and that said Letters Patent is hereby corrected as shown below:

On the Title Page

Column 1, REPLACE "Avago Technologies General IP (Singapore) Pte. Ltd." with "Avago Technologies International Sales Pte. Limited"

Signed and Sealed this
Seventeenth Day of March, 2020

Andrei Iancu
*Director of the United States Patent and Trademark Office*